United States Patent
Sato et al.

(10) Patent No.: US 10,468,386 B1
(45) Date of Patent: Nov. 5, 2019

(54) TSV REDUNDANCY AND TSV TEST SELECT SCHEME

(71) Applicant: MICRON TECHNOLOGY, INC., Boise, ID (US)

(72) Inventors: Homare Sato, Sagamihara (JP); Chikara Kondo, Hachioji (JP); Akira Ide, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/183,961

(22) Filed: Nov. 8, 2018

(51) Int. Cl.
*H01L 25/065* (2006.01)
*G01R 31/28* (2006.01)

(52) U.S. Cl.
CPC ...... *H01L 25/0657* (2013.01); *G01R 31/2853* (2013.01); *H01L 2225/06541* (2013.01); *H01L 2225/06596* (2013.01)

(58) Field of Classification Search
None
See application file for complete search history.

(56) References Cited

U.S. PATENT DOCUMENTS

| | | | |
|---|---|---|---|
| 10,283,178 B2 * | 5/2019 | Takahashi | G11C 8/12 |
| 2011/0085397 A1 * | 4/2011 | Sato | G11C 7/1066 |
| | | | 365/219 |
| 2014/0205056 A1 * | 7/2014 | Yamamoto | G11C 7/1051 |
| | | | 377/54 |

* cited by examiner

*Primary Examiner* — Cassandra F Cox
(74) *Attorney, Agent, or Firm* — Dorsey & Whitney LLP

(57) ABSTRACT

An apparatus including through substrate vias (TSVs) used to interconnect stacked chips is described. The apparatus according to an embodiment includes a plurality of first selection lines each extending in a first direction; a plurality of second selection lines each extending in a second direction to cross the plurality of first selection lines; and a plurality of a TSV units disposed in intersections of the plurality of first selection lines and the plurality of second selection lines, respectively. Each TSV unit of the plurality of TSV units includes a TSV; a switch coupled to the TSV; and a selection circuit. The selection circuit is configured to control a switching state of the switch responsive to each of an associated one of the plurality of first selection lines and an associated one of the plurality of second selection lines being set to an active level.

19 Claims, 12 Drawing Sheets

US 10,468,386 B1

TSV REDUNDANCY AND TSV TEST SELECT SCHEME

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips (e.g., dies) vertically and interconnecting the chips using through substrate vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

For example, High Bandwidth Memory (HBM) is a type of memory including a high-performance DRAM interface chip and vertically stacked DRAM chips. A typical HBM stack of four DRAM chips (e.g., core chips) has two 128-bit channels per chip for a total of eight input/output channels and a width of 1024 bits in total. An interface (IF) chip of the HBM provides an interface with the eight input/output channels, which function independently of each other.

FIG. 1 is a schematic diagram of a TSV array 100 and a test domino switch circuit. The TSV array 100 includes a plurality of TSVs 102, a plurality of redundancy TSVs 104, a plurality of test domino switch circuits (TD-SWs) 106, a plurality of shift registers (SRs) 108, a plurality of control lines 116, and a register line 120.

The TSV array 100 includes TSVs arranged in eight rows and 28 columns. In particular, each of a plurality of TSVs 102 is positioned in a corresponding row of rows 1-8 and a corresponding column of columns 1-27, none of the plurality of TSVs 102 being positioned in the 28th column. Each of a plurality of redundancy TSVs 104(1)-104(8) is positioned in a corresponding row of rows 1-8, and in the 28th column (e.g., last column). Each of the plurality of TSVs 102 and the plurality of redundancy TSVs 104 is coupled to a corresponding one of the plurality of TD-SWs 106. The plurality of SRs 108 are positioned adjacent to a lower side of the TSV array 100. The plurality of SRs 108 are coupled serially by the register line 120. Each of the plurality of SRs 108(1)-108(28) is positioned in a corresponding column of columns 1-28. Each of the plurality of SRs 108 in a corresponding column among columns 1-28 is coupled to one TD-SW among the plurality of TD-SWs in the corresponding column. SRs 108 corresponding to TD-SWs in each of the 28 columns are combined (e.g., grouped) together (e.g., SRs 108(1)-(8) coupled to each of TD-SWs (1,1)-(8,1), respectively are combined together).

Each of the plurality of SRs 108 may store a data value configured to activate or deactivate one of the plurality of TD-SWs 106 corresponding to a respective one of the plurality of TSVs 102. Each data value provided (e.g., transmitted) over the register line 120 may be latched by a corresponding one of the plurality of SRs 108. The data values are shifted serially through the SRs from the SR 108(1) to the SR 108(28), via each of SRs 108(2)-108(27). A respective TD-SW 106 may be activated when the corresponding SR 108 stores a data value corresponding to activation. For example, the TD-SW 106(3,2) is activated when, for example, the SR 108(18) (e.g., the second SR 108 in the third group of SRs 108 which corresponds to the TD-SW in the second row and the third column) stores a data value corresponding to activation.

A data value destined to be latched by one of the SRs 108 to activate or not activate a corresponding TSV is passed at each clock signal from the SR 108(1) to the subsequent one of the SRs 108 until the data value is passed to the one of the SRs 108, and then latched by a corresponding TD-SW to activate or not activate the corresponding TSV. For example, a data value destined to be latched by the SR 108(4) is loaded into the SR 108(1) at a rising edge of a clock signal. Then, the data value destined to be latched by the SR 108(4) is loaded into the SR 108(2) and the data value destined to be latched by the SR 108(3) is loaded into the SR 108(1) at a next rising edge of the clock signal. Then, the data value destined to be latched by the SR 108(4) is loaded into the SR 108(3), the data value destined to be latched by the SR 108(3) is loaded into the SR 108(2), and the data value destined to be latched by the SR 108(2) is loaded into the SR 108(1) at a next rising edge of the clock signal. Then, the data value destined to be latched by the SR 108(4) is loaded into the SR 108(4), the data value destined to be latched by the SR 108(3) is loaded into the SR 108(3), the data value destined to be latched by the SR 108(2) is loaded into the SR 108(2), and the data value destined to be latched by the SR 108(1) is loaded into the SR 108(1), at a next rising edge of the clock signal. The data values for the remaining SRs 108 are serially shifted at each rising edge of the clock signal and provided to the respective SR 108s in a similar manner. All of the plurality of SRs 108 then latch the respective data values when each data value is simultaneously provided to the respective one of the plurality of SRs 108.

When the TD-SW 106(1,1) is triggered, data values originally intended to be provided by all of the plurality of TSVs 102(1)-(27) are instead provided by a combination of remaining ones of the plurality of TSVs 102(2)-(27) and the redundancy TSV 104(1). When the TD-SW 106(1,1) is triggered, a data value originally intended to be provided by the TSV 102(1,1) is provided by the TSV 102(1,2); and a data value originally intended to be provided by the TSV 102(1,27) is provided by the redundancy TSV 104(1). When one of the TD-SWs 106 is triggered, each of the remaining TD-SW 106 in the same row between the triggered TD-SW 106 and the TD-SW 104 in the same row are also triggered. For example, when the TD-SW 106(1,1) is triggered, TD-SWs 106(1,2)-(1,28) are also triggered.

As shown in FIG. 1, a TD-SW(1,3) includes a TSV 102, a D-SW 150, a T-SW 156, and an AND gate 158. The D-SW 150 includes a D-SW normal node N 152 and a D-SW domino node D 154.

The D-SW normal node 152 of the D-SW 150 may be coupled to the TSV 102 via a first node N1. The domino node 154 of the D-SW 150 may be coupled to the TSV 102, via a D-SW line and via the first node N1. A control input of the D-SW 150 is coupled to an output of a respective SR via a second node N2. An input and an output of the T-SW 156 may be coupled, respectively, to a drain voltage/source voltage (Vdd/Vss) signal line 166, and to the TSV 102 via the first node N1. Inputs of the AND gate 158 are coupled, respectively, to an output of the respective SR via a second node N2, and to a TEn signal line 164. An output of the AND gate 158 is coupled to a control input of the T-SW 156 to activate or deactivate the T-SW 156.

An input of the TSV 102(1,3) is coupled to a D-SW normal node 152(1,3) of the D-SW 150(1,3) via a first node N1(1,3). An input of the D-SW 150(1,3) is coupled to an access control logic via an access control logic line 168(1,3). The D-SW normal node 152(1,3) is coupled to the TSV 102(1,3) via the first node N1(1,3). The domino node 154(1,3) is coupled to a TSV 102(1,4) via the D-SW line and via the first node N1(1,4).

The D-SW normal node 152 of the D-SW 150 may be coupled to the TSV 102 via a first node N1. The domino node 154 of the D-SW 150 may be coupled to the TSV 102 of an adjacent domino switch circuit, via a D-SW line and via the first node N1 of the adjacent domino switch circuit. A control input of the D-SW 150 is coupled to an output of the respective SR via a second node N2. An input and an output of the T-SW 156 may be coupled, respectively, to a Vdd/Vss signal line 166, and to the TSV 102 via the first node N1. Inputs of the AND gate 158 are coupled, respectively, to an output of the respective SR via a second node N2, and to a TEn signal line 164. An output of the AND gate 158 is coupled to a control input of the T-SW 156 to activate or deactivate the T-SW 156.

An input of the TSV 102 is coupled to a D-SW normal node 152 of the D-SW 150 via a first node N1. An input of the D-SW 150 is coupled to an access control logic via an access control logic line 168. The D-SW normal node 152 is coupled to the TSV 102 via the first node N1. The domino node 154 is coupled to a TSV 102 of an adjacent domino switch circuit via the D-SW line and via the first node N1 of the adjacent domino switch circuit.

The D-SW 150 may be switched to one of a normal mode and a domino mode. A control input of the D-SW 150 receives a signal from the respective SR via the second node N2. The signal received by the control input of the D-SW 150 is provided to the SR 108(3) from a register line 120. The D-SW 150 in the normal mode is controlled by an inactive signal received from the respective SR via the second node N2. A signal on the access control logic line 168 is provided, via a switch arm of the D-SW 150 coupled to the D-SW normal node 152 in the normal mode, to the TSV 102 via the first node N1. The D-SW 150 receives the signal on the access control logic line 168, and provides the signal to the TSV 102 via the switch arm of the D-SW 150 coupled to the D-SW normal node 152 and via the first node N1. In other words, the switch arm of the D-SW 150 is coupled to the D-SW normal node 152 responsive to the inactive signal received from the respective SR via the second node N2.

In the domino mode, the switch arm of the D-SW 150 is controlled by an active signal received from the respective SR via the second node N2. The signal on the access control logic line 168 is provided to the TSV 102 of an adjacent domino switch circuit via the switch arm of the D-SW 150 coupled to the D-SW domino node 154, and via the first node N1 of the adjacent domino switch circuit. In other words, the D-SW 150 receives the signal on the access control logic line 168 and provides the signal to the TSV 102 of the adjacent domino switch circuit via the switch arm of the D-SW 150 coupled to the D-SW domino node 154 and via the first node N1 of the adjacent domino switch circuit. The switch arm of the D-SW 150 is coupled to the D-SW domino node 154 responsive to the active signal received from the respective SR via the second node N2. In a case where a D-SW 150 of a previous domino switch circuit is also in the domino mode, a signal on an access control logic line 168 of the previous domino switch circuit is provided to the TSV 102 via a switch arm of a D-SW 150 of the previous domino switch circuit coupled to a D-SW domino node 154 of the previous domino switch circuit, via a D-SW line, and via the first node N1.

The switch arm of the T-SW 156 may be controlled to be open when the T-SW 156 is turned off responsive to an inactive signal output by the AND gate 158. A signal output by the AND gate 158 is inactive when at least one of a signal output by the respective SR and the signal on the TEn signal line 164 is inactive.

The switch arm of the T-SW 156 may be controlled to be closed when the T-SW 156 is turned on responsive to an active signal output by the AND gate 158. The signal output by the AND gate 158 is active when both of the signal output by the respective SR and the signal on the TEn signal line 164 are active.

The active signal on the TEn signal line 164 may be provided to the control input of the T-SW 156 via the AND gate 158 when the signal output by the respective SR is active, to thereby provide the signal on the Vdd/Vss signal line 166 to the TSV 102 via the closed switch arm of the T-SW 156.

BRIEF DESCRIPTION OF THE DRAWINGS

To easily identify the discussion of any particular element or act, the most significant digit or digits in a reference number refer to the figure number in which that element is first introduced.

DETAILED DESCRIPTION OF THE PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In a related art semiconductor device, defects in a connection (e.g., TSVs), such as improper connections to adjacent wirings, open terminals with high impedance due to poor connection, and high resistance due to contamination, in TSVs for transmitting data between adjacent dies stacked to each other may occur. These types of defects in connections may result in a decreased yield of devices. Redundancy TSV(s) used in the related art to provide signals when errors occur on the TSV(s) require complex wiring. The complex wiring takes up large amounts of space on the related art semiconductor device.

Figure 1:
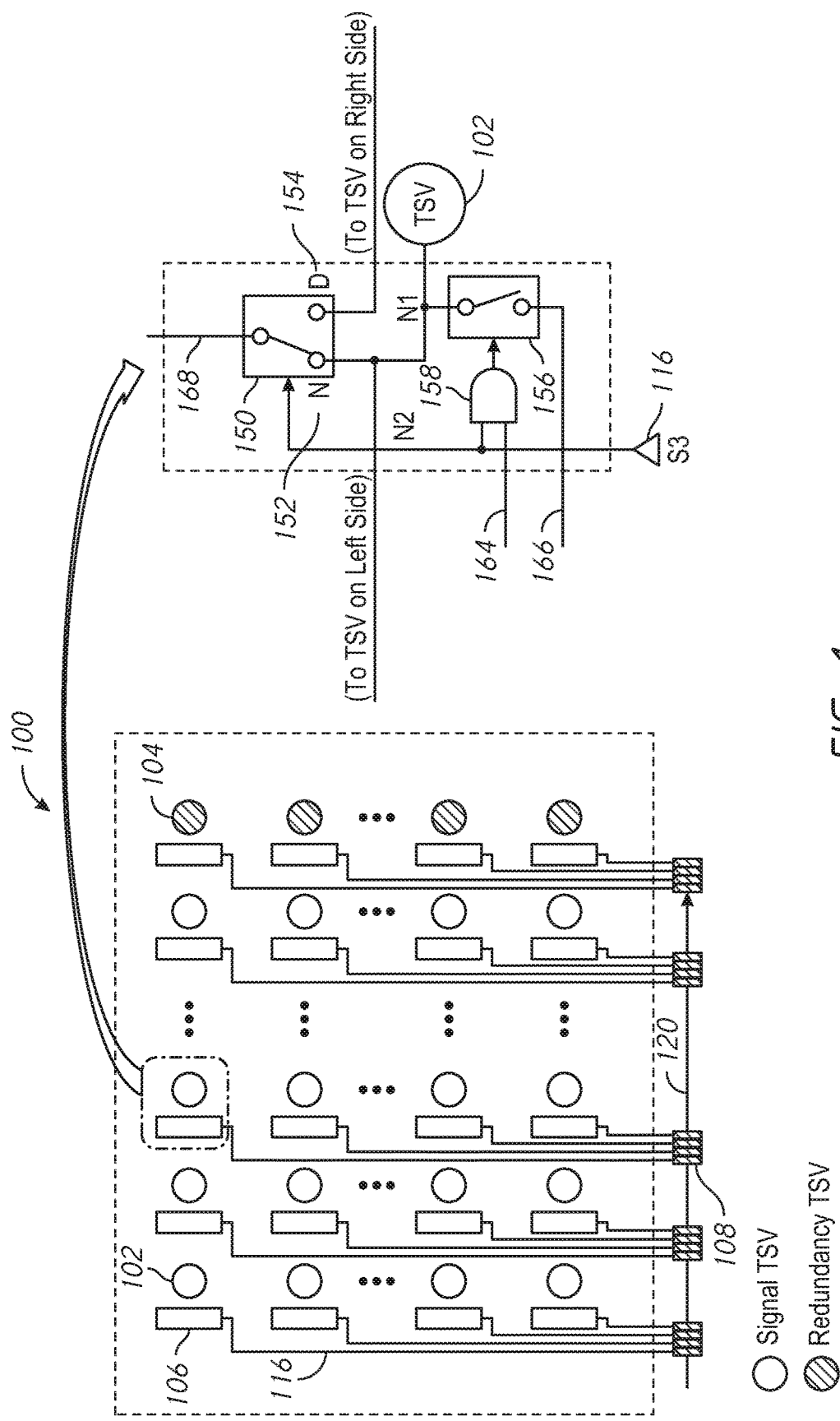
FIG. 1 is a schematic diagram of a TSV array and a test domino switch circuit.
Figure 2:
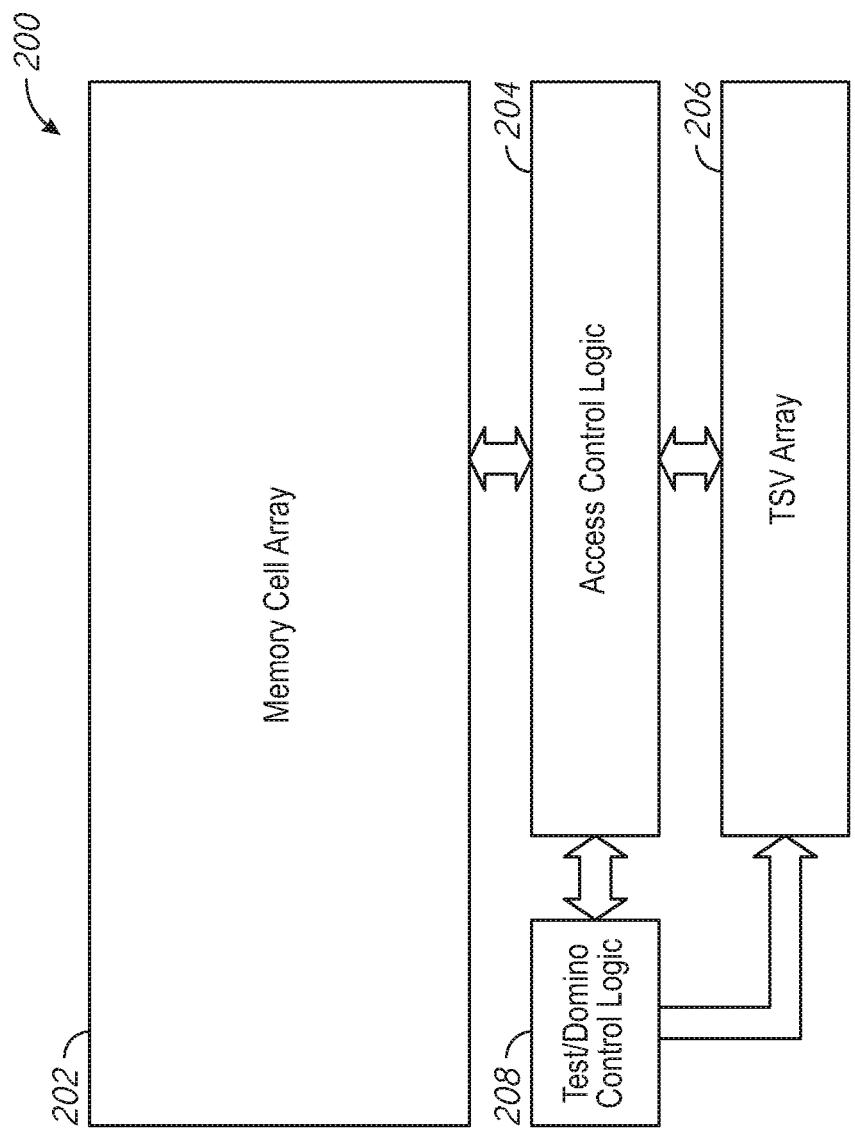
FIG. 2 is a schematic diagram of a memory system according to an embodiment of the disclosure.

FIG. 2 is schematic diagram of a semiconductor device 200 according to an embodiment of the disclosure. The semiconductor device 200 includes a memory cell array 202, an access control circuit 204, a TSV array, and a test/domino control logic 208. The memory cell array 202 may store data. The access control circuit 204 may perform read and write operations on the memory cell array 202. A TSV array 206 includes TSVs arranged in an array, and provide coupling to the access control logic 204. A test/domino control logic 208 may control coupling of the access control logic through the TSV array 206.

Figure 3:
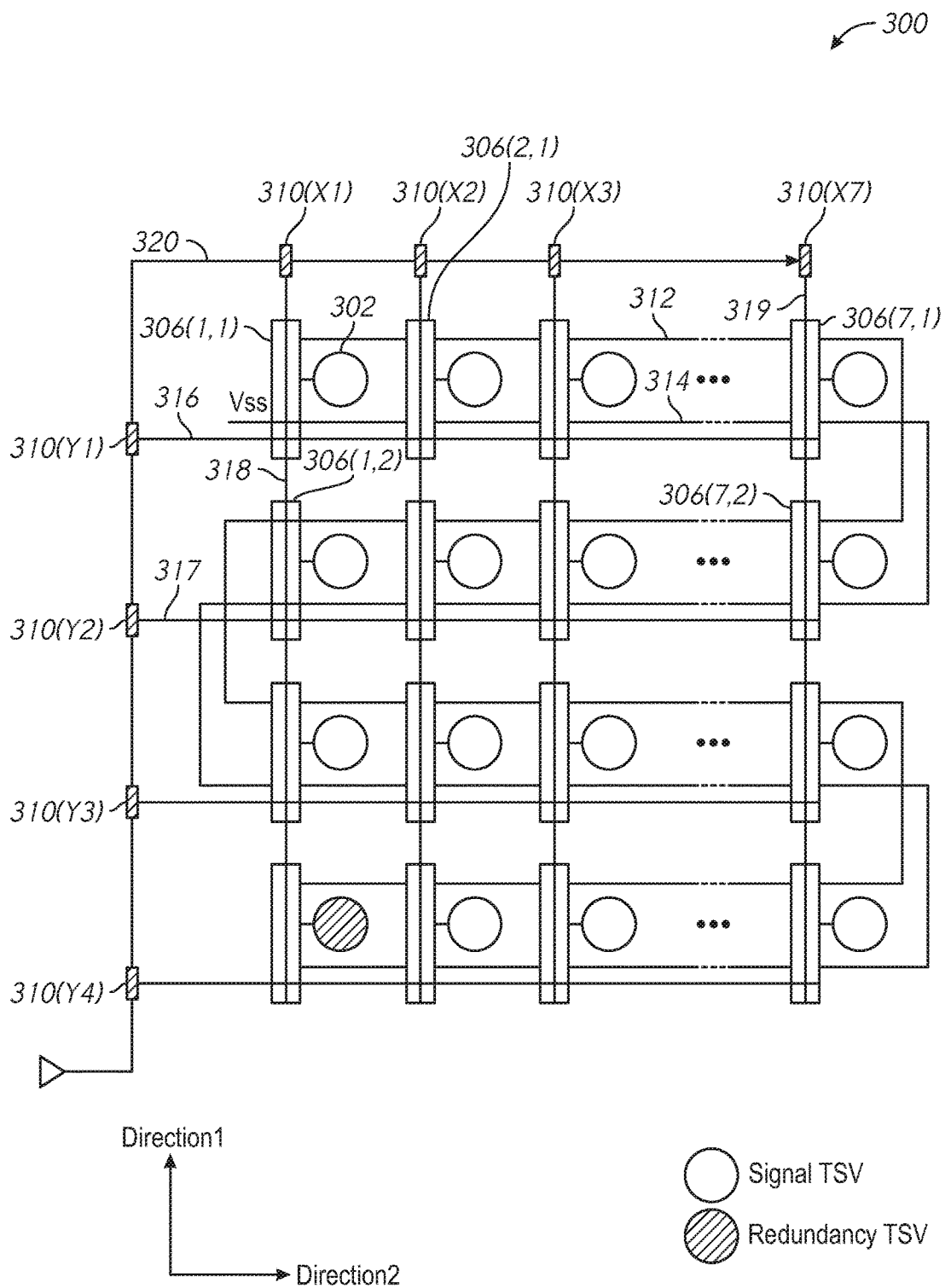
FIG. 3 is a schematic diagram of a TSV array according to an embodiment of the disclosure.

FIG. 3 is a schematic diagram of a TSV array 300 according to an embodiment of the disclosure. The TSV array 300 may be included in the TSV array 206 of FIG. 2 in some embodiments of the disclosure.

The TSV array 300 includes a plurality of through-silicon/substrate vias (TSVs) 302 arranged in an array, and further includes a plurality of TSV units 306. Each of the TSV units 306 and a respective TSV 302 are associated with one another. The TSV array 300 further includes a plurality of selection lines X1-X7 each extending in a first direction Direction1, and a plurality of selection lines Y1-Y4 each extending in a second direction Direction2, which is perpendicular to the Direction1. Each of the selection lines X1-X7 is coupled to a respective register 310, and similarly, each of the selection lines Y1-Y7 is coupled to a respective register 310. The registers 310 coupled to the selection lines X1-X7 and Y1-Y7 are coupled to a signal line 320. The registers 310 may be located outside the area of the TSVs 302. The registers 310 may be shift registers in some embodiments of the disclosure.

Each TSV unit 306 is coupled to two selection lines, in particular, one X selection line and one Y selection line. The TSV unit 306 is at a cross-point of the X and Y selection lines. The cross-point arrangement of X and Y selection lines may be advantageous by reducing a number of selection lines and a number of registers for controlling the TSV units 306, as compared to an arrangement of including one register and selection line for each TSV unit. A reduced number of selection lines and registers requires less space, and reduces a number of lines running in between the TSVs and through the TSV array.

The TSV units 306 are coupled to a signal line 312 and to a voltage line 314. The voltage line 314 may provide a voltage, for example, a power supply voltage Vdd, a reference voltage Vss, or other voltage to each of the TSV units 306. The signal line 312 and the voltage line 314 extend through the TSV units 306 in the Direction2, and are coupled at the ends of the array when extending in the Direction1. For example, in the TSV array 300 of FIG. 3, the signal line 312 and the voltage line 314 snake through the TSV units 306, first coupling to the TSV units 306 associated with the selection line Y1 and heading in a direction from TSV unit 306 (1,1) to TSV unit 306 (7,1), and then coupling to the TSV units 306 associated with the selection line Y2 and heading in a direction from TSV unit 306 (7,2) to TSV unit 306 (1,2). The signal line 312 and the voltage line 314 head back in the other direction through the TSV units 306 associated with the selection line Y3 and then back through the TSV units 306 associated with the selection line Y4.

In operation, control information may be provided on the signal line 320 and shifted through the registers 310 to provide respective control information to each of the registers 310. For example, in the TSV array 300 of FIG. 3 control information including 11-bits may be provided through the signal line 320 starting with the register 310(Y4) and shifted bit-by-bit sequentially through registers for selection lines Y3, Y2, Y1, X1, X2, X3, . . . , to X7 until one bit is stored by each register 310. The control information controls whether a respective selection line is set to an active level or to an inactive level. For example, when a register 310 stores a high logic level (e.g., "1" logic level), the respective selection line is set to an active level, and conversely, when a register 310 stores a low logic level (e.g., "0" logic level), the respective selection line is set to an inactive level.

As will be described in more detail below, the TSV units 306 may be used to change a coupling to a TSV 302, for example, from one TSV to an adjacent TSV. For example, when the X selection line and Y selection line for a TSV unit are both set to an active level, the respective TSV unit shifts the coupling from its associated TSV to the TSV associated with an adjacent TSV unit. One or more of the TSVs 302 may be designated as a redundancy TSV (identified in FIG. 3 in cross-hatch). The coupling to an adjacent TSV includes coupling to the redundancy TSV. By changing the coupling of the TSVs 302, including to the redundancy TSV, a TSV array including a defective TSV may be repaired.

The TSV array 300 is shown in FIG. 3 as including 28 TSVs 302 arranged in an array of 4×7 TSVs 302. However, it will be appreciated that embodiments of the disclosure are not limited to the particular number of TSVs shown in FIG. 3, or to the particular arrangement of the TSVs shown in FIG. 3. For example, in some embodiments of the disclosure, a greater number of TSVs and TSV units may be included in a TSV array without departing from the scope of the disclosure. Moreover, the disclosure is not limited to the particular arrangement of the TSV units 306, the selection lines X1-X7 and Y1-Y4, the signal line 312, voltage line 314, the registers 310, and the signal line 320 shown in FIG. 3.

Figure 4:
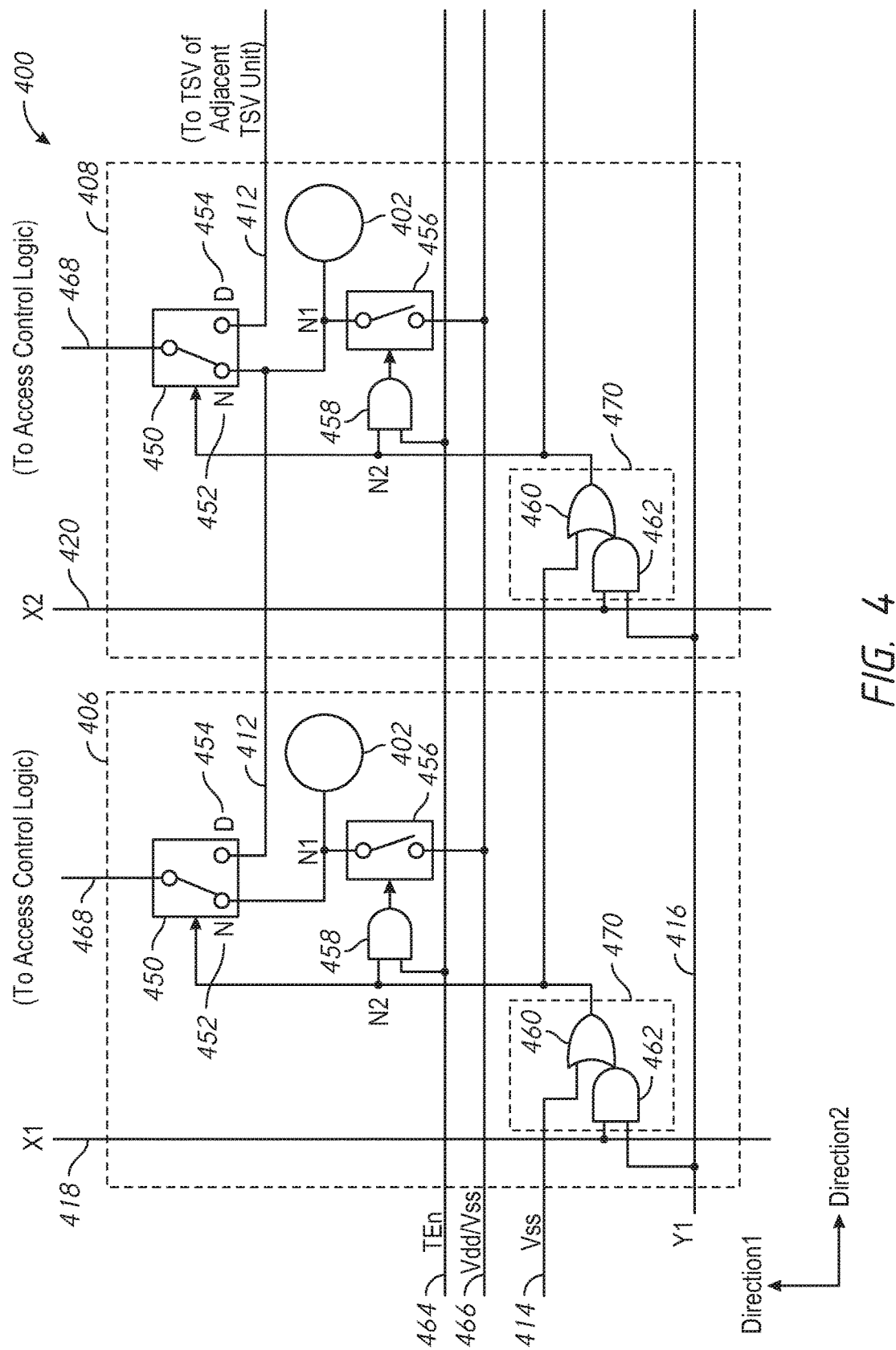
FIG. 4 is a schematic diagram of TSV units according to an embodiment of the disclosure.

FIG. 4 is a schematic diagram of a plurality of TSV units according to an embodiment of the disclosure. FIG. 4 illustrates two adjacent TSV units 406 and 408. The TSV unit 406 may be described as coupled "upstream" of the TSV unit 408. The TSV unit 408 may be described as coupled "downstream" of the TSV unit 406. The TSV units 406 and 408 may be included in the TSV array 206 (FIG. 2) in some embodiments of the disclosure. The TSV units 406 and 408 may be included in the TSV units 306(1,1) and 306(2,1), respectively, (FIG. 3) in some embodiments of the disclosure.

The TSV unit 406 is coupled to a selection line X1 418 that extends in a direction Direction1 and to a selection line Y1 416 that extends in a direction Direction2. The TSV unit 408 is coupled to a selection line X2 420 that extends in Direction1 and to the selection line Y1 416. The TSV unit 406 and the TSV unit 408 are adjacent one another along the Direction2.

The TSV unit 406 includes switch circuits 450 and 456 (also referred to as switch 450 and switch 456) coupled to an associated TSV 402. The TSV unit 406 further includes a selection circuit 470 that is coupled to the selection line X1 418 and to the selection line Y1 416. The selection circuit 470 of the TSV unit 406 is also coupled to be provided with a constant voltage corresponding to a logic level (e.g., a Vss voltage corresponding to a low logic level) on line 414. The selection circuit 470 may be considered associated with the selection line X1 418 and the selection line Y1 416. In the embodiment of the disclosure of FIG. 4, the selection circuit 470 includes a logic gate 462 that is coupled to the selection lines 416 and 418, and further includes a logic gate 460. In the selection circuit 470 of FIG. 4, the logic gate 462 is shown as an AND logic gate and the logic gate 460 is shown as an OR gate. However, in other embodiments of the disclosure, the specific logic gates and circuits included in the selection circuit 470 may be different without departing from the scope of the disclosure. The selection circuit 470 controls the states of the switches 450 and 456 based on logic levels of the selection lines 416 and 418. For example, the selection circuit 470 controls the states of the switches 450 and 456 by responding to the levels of the selection lines 416 and 418.

The switch 450 includes a node N 452 and node D 454, and is coupled to a signal line 468. The TSV 402 is coupled to the node N 452. The TSV unit 408 that is adjacent the TSV unit 406 is coupled to node D 454, in particular, the TSV 402 of the TSV unit 408. The signal line 468 may be coupled to other circuits. In some embodiments of the disclosure, the signal line 468 may be coupled to access control logic, for example, access control logic 204 of FIG. 2. The selection circuit 470 may cause the switch 450 to form a conductive path between the signal line 468 and the TSV 402 or to cause the switch 450 to form a conductive path between the signal line 468 and the adjacent TSV unit 408. For example, when one of the selection lines 416 and 418 is set to an inactive level (e.g., a low logic level), the selection circuit 470 causes the switch 450 to form the conductive path between the signal line 468 and the TSV 402, and when both the selection lines 416 and 418 are set to an active level (e.g., a high logic level), the selection circuit 470 causes the switch 450 to form the conductive path between the signal line 468 and the adjacent TSV unit 408.

The switch 456 is coupled to the TSV 402 and further coupled to a voltage line 466. The voltage line 466 may provide a voltage, for example, a power supply voltage Vdd, a reference voltage Vss, or other voltage. A logic gate 458 (e.g., an AND logic gate in some embodiments) coupled to the selection circuit 470 and a test enable selection line 464 provides a control signal to the switch 456. The selection line 464 has a logic level controlled by a test enable signal TEn that is provided to the selection line 464. The selection circuit 470 may cause the switch 456 to form a conductive path between the voltage line 466 and the TSV 402. For example, when both the selection lines 416 and 418 are set to an active level, and the selection line 464 is set to an active level (e.g., the TEn signal is active), the selection circuit 470 causes the switch circuit 456 to form a conductive path between the voltage line 466 and the TSV 402.

The TSV unit 408 is similar to the TSV unit 406. For example, the TSV unit 408 may include similar circuits as the TSV unit 406. Circuits that are similar in the TSV unit 408 are referenced with the same reference number as in the TSV unit 406. The selection circuit 470 of the TSV unit 408, however, is coupled to the selection line X2 420 (instead of the selection line X1 418) and is further coupled to the TSV unit 406, for example, to the selection circuit 470 of the TSV unit 406. The TSV unit 408 may also be coupled to another adjacent TSV unit (not shown in FIG. 4) that is similar to the TSV units 406 and 408. The TSV unit adjacent the TSV unit 408 would be coupled to a respective selection line that extends in Direction1 (similar to selection lines 418 and 420) and to the TSV unit 408 (in a similar manner as TSV unit 408 is coupled to the TSV unit 406).

The TSV units 406 and 408 may be used when the respective TSV 402 is tested for operation, such as to test resistance of the respective TSV 402. For example, assuming the TSV 402 of TSV unit 406 is to be tested, the test enable signal TEn is an active level, which sets the selection line 464 to an active level, and the selection lines 416 and 418 are set to an active level. As a result, selection circuit causes the switch 456 to form the conductive path between the TSV 402 and the voltage line 466 which provides a voltage, for example, for testing the resistance of the TSV 402. During the testing, the switch 450 no longer forms a conductive path between the signal line 468 and the TSV 402, thereby preventing the voltage of the voltage line 466 from being provided to the signal line 468.

Testing of the TSV unit 408 is similar to that as described for the TSV unit 406. However, the selection line 420 is set to an active level and the selection line 418 associated with the TSV unit 406 is set to an inactive level. As a result, the selection circuit 470 of the TSV unit 408 is provided a low logic level from the selection circuit 470 of the TSV unit 406, and the switch 456 of the TSV unit 408 forms a conductive path between the voltage line 466 and its respective TSV 402 (and the switch 456 of the TSV unit 406 does not form a conductive path between the voltage line 466 and its respective TSV 402). The switch 450 of the TSV unit 408 does not form a conductive path between its respective signal line 468 and TSV 402.

The TSV units 406 and 408 may also be used to change a coupling between a signal line and a TSV for a TSV unit, to a coupling between the signal line for the TSV unit to the TSV of an adjacent TSV unit. For example, the TSV units 406 and 408 may be used to change the coupling between the signal line 468 and the TSV 402 of the TSV unit 406 to a coupling between the signal line 468 of the TSV unit 406 and the TSV 402 of the TSV unit 408. Such an arrangement may be used to shift a coupling of an input from a defective TSV of a TSV unit to a functional TSV of another (e.g., adjacent) TSV unit.

For the following example, it is assumed that the TSV 402 of the TSV unit 406 is defective (e.g., resistance is too high) and the TSV 402 of the TSV unit 408 is functional.

As previously described, when either of the selection lines 416 or 418 are set to an inactive level, the selection circuit 470 of the TSV unit 406 causes its respective switch 450 to form the conductive path between the associated signal line 468 and the TSV 402. However, when both the selection lines 416 and 418 are set to an active level, the selection circuit 470 causes the switch 450 to form the conductive path between the signal line 468 and the adjacent TSV unit 408.

To change the coupling between the signal line 468 associated with TSV unit 406 and its respective TSV 402, both the selection lines 416 and 418 are set to an active level. The selection circuit 470 provides an output to cause the switch 450 to change the coupling of the signal line 468 from the node N 452 to the node D 454. The node D 454 is coupled to the TSV 402 of the adjacent TSV unit 408. Thus, by changing the coupling of the signal line 468 from node N to node D, the selection circuit 450 has caused the switch 450 to form a conductive path between the signal line 468 associated with the TSV unit 406 and the TSV 402 of the TSV unit 408.

Due to the TSV 402 of the TSV unit 408 being coupled to the signal line 468 associated with the TSV unit 406, the signal line 468 associated with the TSV unit 408 will need to be coupled to the TSV 402 of another TSV unit. As with the TSV unit 406 and adjacent TSV unit 408, the signal line 468 of the TSV unit 408 may be coupled to the TSV 402 of an adjacent TSV unit. The output of the selection circuit 470 of the TSV unit 406 which caused the switch 450 of the switch 450 to change coupling of the signal line 468 from node N 452 to node D 454 is also provided to the selection circuit 470 of the TSV unit 408. As a result, the selection circuit 470 of the TSV unit 408 causes its respective switch 450 to change coupling of the signal line 468 associated with the TSV unit 408 from node N 452 to node D 454, which may be coupled to a TSV of an adjacent TSV unit (similar to that previously described for TSV units 406 and 408).

The TSV units starting with the TSV unit having a respective defective TSV to a last TSV unit coupled to a redundancy TSV, will all have the respective switch circuits coupling a signal line associated with the TSV unit to a TSV of an adjacent TSV unit. The last TSV unit will have its respective signal line coupled to the redundancy TSV. In this manner, a defective TSV may be replaced by shifting the coupling of signal lines to TSVs of adjacent TSV units.

Figure 5:
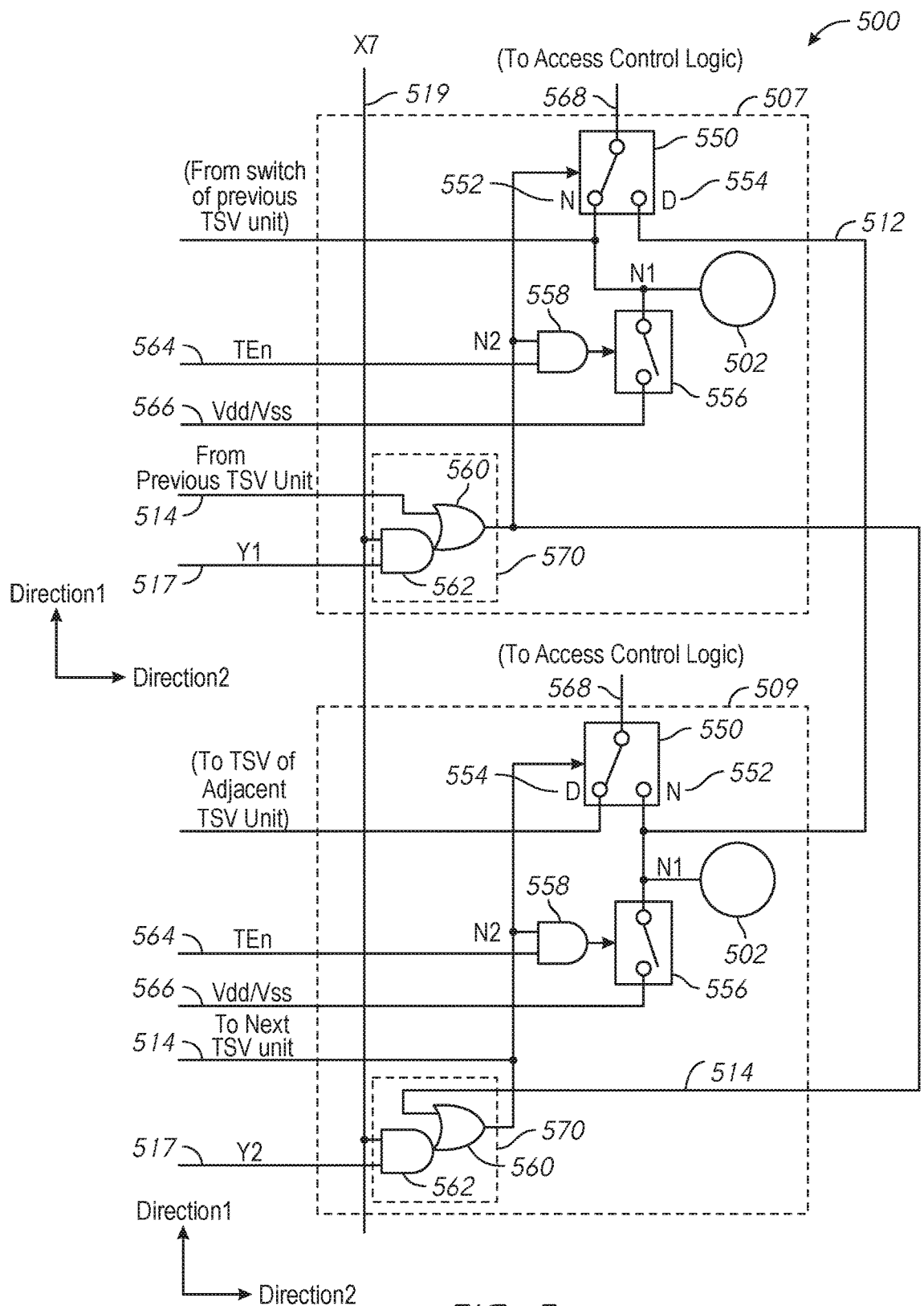
FIG. 5 is a schematic diagram of a plurality of through-silicon/substrate via (TSV) units according to an embodiment of the disclosure.

FIG. 5 is a schematic diagram of a plurality of TSV units according to an embodiment of the disclosure. FIG. 5 illustrates two adjacent TSV units 507 and 509. The TSV unit 507 may be upstream of the TSV unit 509, and the TSV unit 509 is downstream of the TSV unit 507. The TSV units 507 and 509 may be included in the TSV array 206 (FIG. 2) in some embodiments of the disclosure. The TSV units 507 and 509 may be included in the TSV units 306(7,1) and 306(7,2), respectively, (FIG. 3) in some embodiments of the disclosure.

The TSV unit 507 is coupled to a selection line X7 519 that extends in the direction Direction1 and to a selection line Y1 516 that extends in the direction Direction2. The TSV unit 509 is coupled to the selection line X7 519 that extends in Direction1 and to a selection line Y2 517 that extends in the Direction2. The TSV unit 507 and the TSV unit 509 are adjacent one another along the Direction1.

The TSV units 507 and 509 include components similar to those previously described with reference to the TSV units 406 and 408 of FIG. 4. For example, the TSV unit 507 includes switch circuits 550 and 556 (also referred to as switch 550 and switch 556) coupled to an associated TSV 502. The TSV unit 507 further includes a selection circuit 570 that is coupled to the selection line X7 519 and to the selection line Y1 516. The selection circuit 570 of the TSV unit 507 is also coupled to be provided a constant voltage corresponding to a logic level (e.g., a Vss voltage corresponding to a low logic level) on line 514. The selection circuit 570 may be considered associated with the selection line X7 519 and the selection line Y1 516.

The TSV unit 509 is similar to the TSV unit 507. For example, the TSV unit 509 may include similar circuits as the TSV unit 507. Circuits that are similar in the TSV unit 509 are referenced with the same reference number as in the TSV unit 507. However, the selection circuit 570 of the TSV unit 509 is coupled to the selection line X7 519 and to the selection line Y2 517.

In the embodiment of the disclosure of FIG. 5, the selection circuit 570 includes a logic gate 562 that is coupled to the selection lines 516 and 519, and further includes a logic gate 560. In the selection of FIG. 5, the logic gate 562 is shown as an AND logic gate and the logic gate 560 is shown as an OR gate. However, in other embodiments of the disclosure, the specific logic gates and circuits included in the selection circuit 570 may be different without departing from the scope of the disclosure. The selection circuit 570 controls the states of the switches 550 and 556 based on logic levels of the selection lines 516 and 518. For example, the selection circuit 570 controls the states of the switches 550 and 556 by responding to the levels of the selection lines 516 and 519.

Similar to the switch 450 of FIG. 4, the switch 550 forms a conductive path between a signal line 568 and either node N 552 or node D 554. The node N 552 is coupled to the TSV 502 and the node D 554 is coupled the TSV 502 of the TSV unit 509. The selection circuit 570 causes the switch 550 to form the conductive paths. For example, when either of the selection lines 516 or 519 is set to an inactive level (e.g., a low logic level), the selection circuit 570 causes the switch 550 of the TSV unit 507 to form the conductive path between the signal line 568 and the TSV 502, and when both the selection lines 516 and 519 are set to an active level (e.g., a high logic level), the selection circuit 570 causes the switch 550 to form the conductive path between the signal line 568 and the adjacent TSV unit 509.

Similar to the switch 456 of FIG. 4, the switch 556 forms a conductive path between a voltage line 566 and the TSV 502. The voltage line 566 may provide a voltage, for example, a power supply voltage Vdd, a reference voltage Vss, or other voltage. A logic gate 558 (e.g., an AND logic gate in some embodiments) coupled to the selection circuit 570 and a test enable selection line 564 provides a control signal to the switch 556. The selection line 564 has a logic level controlled by a test enable signal TEn that is provided to the selection line 564. The selection circuit 570 may cause the switch 556 to form a conductive path between the voltage line 566 and the TSV 502. For example, when both the selection lines 516 and 518 are set to an active level, and the selection line 566 is set to an active level (e.g., the TEn signal is active), the selection circuit 570 causes the switch circuit 556 to form a conductive path between the voltage line 566 and the TSV 502.

The TSV units 507 and 509 may be used to test the respective TSV 408 as well as to change a coupling between a signal line and a TSV of a TSV unit, as previously described with reference to TSV units 406 and 408 of FIG. 4. In contrast to the TSV units 406 and 408 of FIG. 4, however, the TSV units 507 and 509 of FIG. 5 are adjacent one another along the Direction1. An upstream TSV unit may be coupled to the TSV unit 507 along the Direction2 similar to that as previously described for the coupling between the TSV units 406 and 408. A downstream TSV unit may be coupled to the TSV unit 509 along the Direction2 similar to that previously described for the coupling of the TSV units 406 and 408. However, a progression of the adjacent TSV units along the Direction2 from the TSV unit 509 is in a direction opposite to that shown for the TSV units 406 and 408. The TSV units 507 and 509 may be used to switch a direction of progression from an upstream TSV unit coupled to the TSV unit 507 to a downstream TSV unit coupled to the TSV unit 509. TSV units similar in arrangement to the TSV units 507 and 509, but oriented in an opposite direction, may be used to switch the direction of progression in an opposite direction as well.

Those of ordinary skill in the art will have sufficient understanding from the previous description of the TSV units 406, 408, 507, and 509 to understand the arrangement of the circuits of the TSV unit to provide such a progression. As such, a specific description for the TSV units will not be provided in the interest of brevity.

Figure 6:
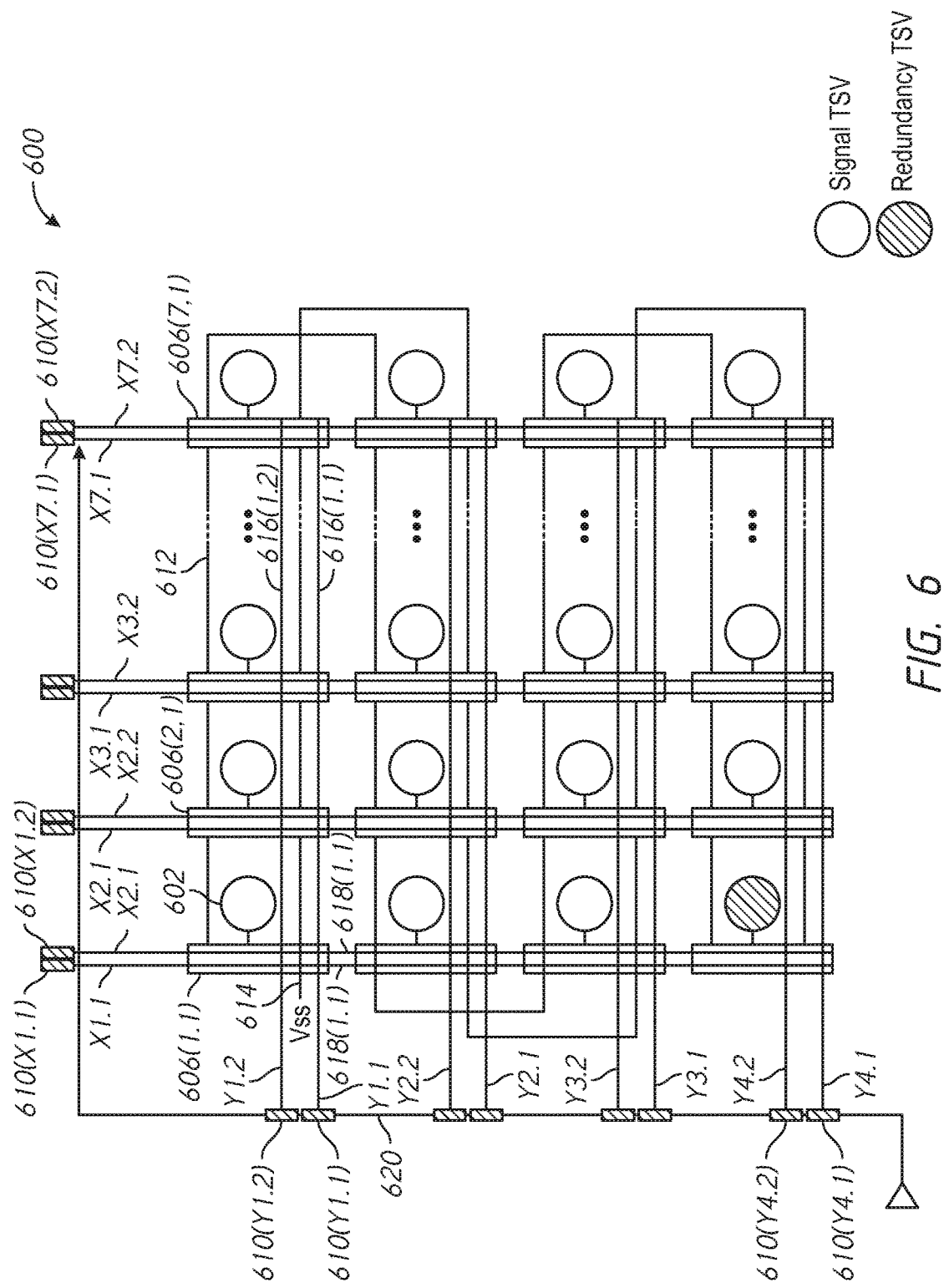
FIG. 6 is a schematic diagram of a TSV array 600 according to an embodiment of the disclosure.

FIG. 6 is a schematic diagram of a TSV array 600 according to an embodiment of the disclosure. The TSV array 600 may be included in the TSV array 206 of FIG. 2 in some embodiments of the disclosure.

The TSV array 600 is similar to the TSV array 300 of FIG. 3. The TSV array 600 includes a plurality of TSVs 602 and a plurality of TSV units 606. Each of the TSV units 606 and a respective TSV 602 are associated with one another. The TSV units 606 are coupled to a signal line 612 and to a voltage line 614. The voltage line 614 may provide a voltage, for example, a power supply voltage Vdd, a reference voltage Vss, or other voltage to each of the TSV units 606. However, in contrast to the TSV array 300 of FIG. 3, the TSV array 600 of FIG. 6 includes selection lines X1.1-X7.1 and selection lines X1.2-X7.2 each coupled to a respective register 310, and further includes selection lines Y1.1-Y7.1 and selection lines Y1.2-Y7.2 each coupled to a respective register 310. The registers 610 may be shift registers in some embodiments of the disclosure. The registers 610 may be coupled serially to signal line 620.

Each TSV unit 606 is coupled to four selection lines, in particular, two X selection lines and two Y selection lines. One of the X selection lines (e.g., X(x.1)) and one of the Y selection lines (e.g., Y(y.1)) is used similarly as previously described for the X selection line and the Y selection line of FIG. 4. The other X selection line (e.g., X(x.2)) and the other Y selection line (e.g., Y(y.2)) may be used to activate other circuitry of the respective TSV circuit. For example, in some embodiments of the disclosure, the X selection line X(x.2) and Y selection line Y(y.2) may be used to activate circuitry in the respective TSV unit related to testing an associated TSV 602.

Control information may be provided to each of the registers 610 through the signal line 620 in a manner similar to that previously described with reference to FIG. 3. For example, in the TSV array 600 of FIG. 6 control information including 22-bits may be provided through the signal line 420 starting with the register 410(Y4.1) and shifted bit-by-bit sequentially through the registers 610 for selection lines Y4.2, Y3.1, Y3.2, . . . , X1.1, X1.2, X2.1, X2.2, . . . , to X7.2 until one bit is stored by each register. The control information controls whether a respective selection line is set to an active level or to an inactive level.

The TSV units 606 may be used to change a coupling to a TSV 602, for example, from one TSV to an adjacent TSV. For example, when the X(x.1) selection line and Y(y.1) selection line for a TSV unit are both set to an active level, the respective TSV unit shifts the coupling from its associated TSV to the TSV associated with an adjacent TSV unit. One or more of the TSVs 602 may be designated as a redundancy TSV (identified in FIG. 6 in cross-hatch). The coupling to an adjacent TSV includes coupling to the redundancy TSV. By changing the coupling of the TSVs 602, including to the redundancy TSV, a TSV array including a defective TSV may be repaired.

The TSV array 600 is shown in FIG. 3 as including 28 TSVs 602 arranged in an array of 4×7 TSVs 602. However, it will be appreciated that embodiments of the disclosure are not limited to the particular number of TSVs shown in FIG. 6, or to the particular arrangement of the TSVs shown in FIG. 6. For example, in some embodiments of the disclosure, a greater number of TSVs and TSV units may be included in a TSV array without departing from the scope of the disclosure. Moreover, the disclosure is not limited to the particular arrangement of the TSV units 606, the selection lines X1.1-X7.1, X1.2-X7.2, Y1.1-Y7.1, and Y1.2-Y4.2, the signal line 612, voltage line 614, the registers 610, and the signal line 620 to particular arrangement shown in FIG. 6.

Figure 7:
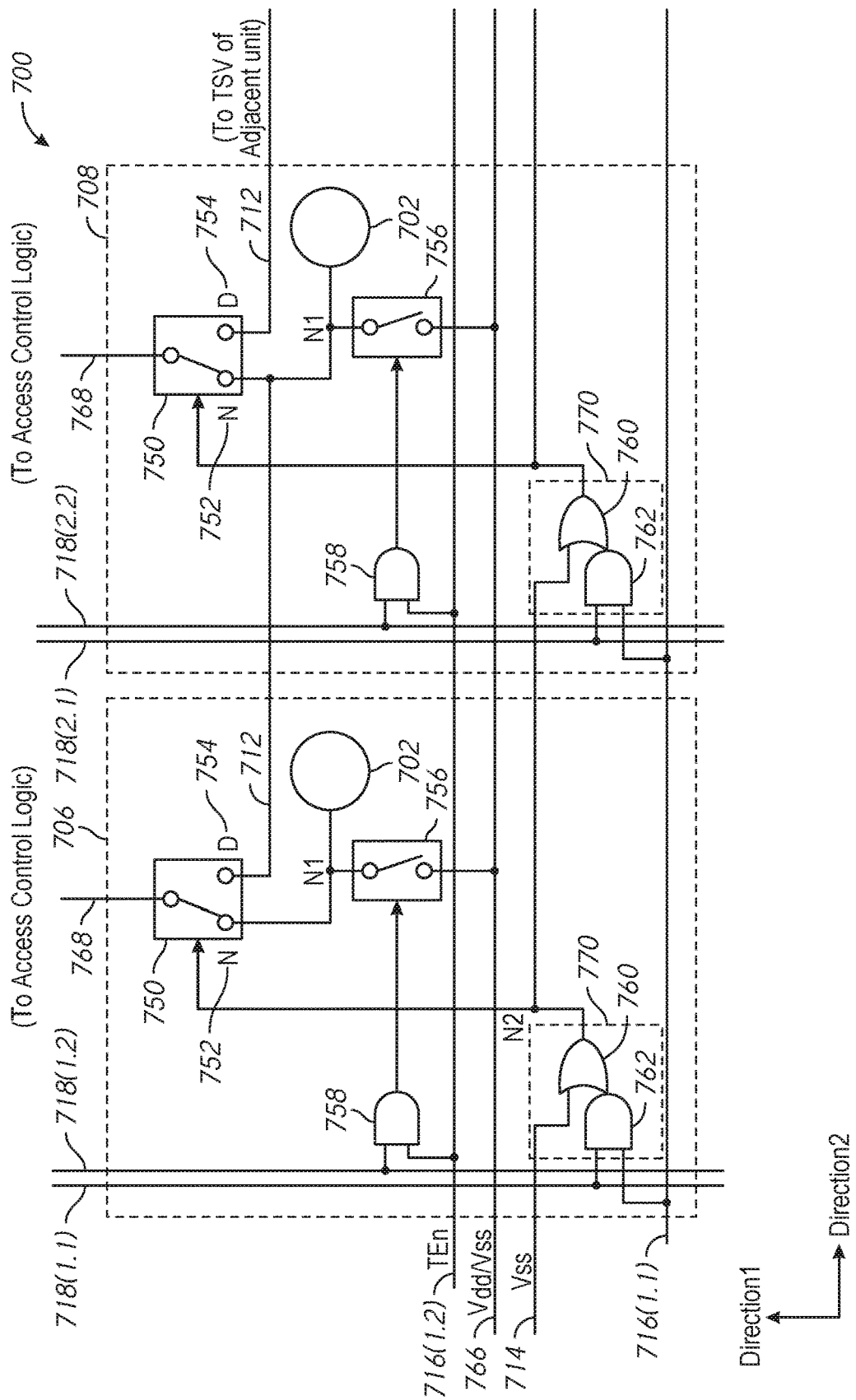
FIG. 7 is a schematic diagram of a plurality of TSV units according to an embodiment of the disclosure.

FIG. 7 is a schematic diagram of a plurality of TSV units according to an embodiment of the disclosure. FIG. 4 illustrates two adjacent TSV units 706 and 708. The TSV unit 706 is upstream of the TSV unit 708, and the TSV unit 708 is downstream of the TSV unit 706. The TSV units 706 and 708 may be included in the TSV array 206 (FIG. 2) in some embodiments of the disclosure. The TSV units 706 and 708 may be included in the TSV units 606(1,1) and 606(2,1) (FIG. 6), respectively, in some embodiments of the disclosure.

The TSV units 706 and 708 may be similar to the TSV units 406 and 408 previously described with reference to FIG. 4. Each of the TSV units 706 and 708 includes a respective selection circuit 770, switch 750, switch 756, and logic gate 758, and is associated with a respective TSV 702. The selection circuit 770 of the TSV unit 706 is coupled to selection lines 718(1.1) and 716(1.1) and the selection circuit 770 of the TSV unit 708 is coupled to selection lines 718(2.1) and 716(1.1). A voltage line 766 is coupled to the switch 756 of the TSV units 706 and 708, and provides a voltage (e.g., a power supply voltage Vdd, a reference voltage Vss, or other voltage). The selection circuit 770 of the TSV unit 706 is also coupled to be provided a constant voltage corresponding to a logic level (e.g., a Vss voltage corresponding to a low logic level) on line 714. In contrast to the TSV units 306 and 308 of FIG. 3, the TSV units 706 and 708 are coupled to additional selections lines. For example, the logic gate 758 of the TSV unit 706 is coupled to selection lines 718(1.2) and 716(1.2) and the logic gate of the TSV unit 708 is coupled to selection lines 718(2.2) and 716(1.2).

Operation of the switch circuit 750 as controlled by the selection circuit 770 is similar to that described for the switch circuit 450 as controlled by the selection circuit 470. For example, the signal line 768 associated with the TSV unit 706 may be coupled to the TSV 702 of the TSV unit 706 or coupled to the TSV 702 of the TSV unit 708. The selection circuit 770 causes the switch 750 to form a conductive path between the signal line 768 and the TSV 702 of the TSV unit 706, or between the signal line 768 and the TSV 702 of the TSV unit 708.

In contrast to the switch 456 described with reference to FIG. 4, the switch circuit 756 is controlled by the respective selection lines 718(x.2) and 716(y.2) rather than by the X and Y selection lines provided to the selection circuit 770 and a test enable signal TEn. For example, when respective the selection lines 718(x.2) and 716(x.2) are set to an active level, the switch 756 forms a conductive path between the voltage line 766 and the TSV 702. If either of the selection lines 718(x.2) or 716(y.2) are set to an inactive state for a TSV unit, however, the switch 756 does not form a conductive path between the voltage line 766 and the TSV 702. Thus, testing of a TSV 702 of a TSV unit may be controlled using the respective selection lines 718(x.2) and 716(y.2).

While example TSV units arranged adjacent along the Direction2 is described with reference to FIG. 7, TSV units arranged adjacent along a the Direction1 have not been specifically described. Such TSV units would be similar to the TSV units 507 and 509 described with reference to FIG. 5, but coupled to additional selection lines (x.2) and (y.2) similar to that described with reference to FIG. 7.

Figure 8:
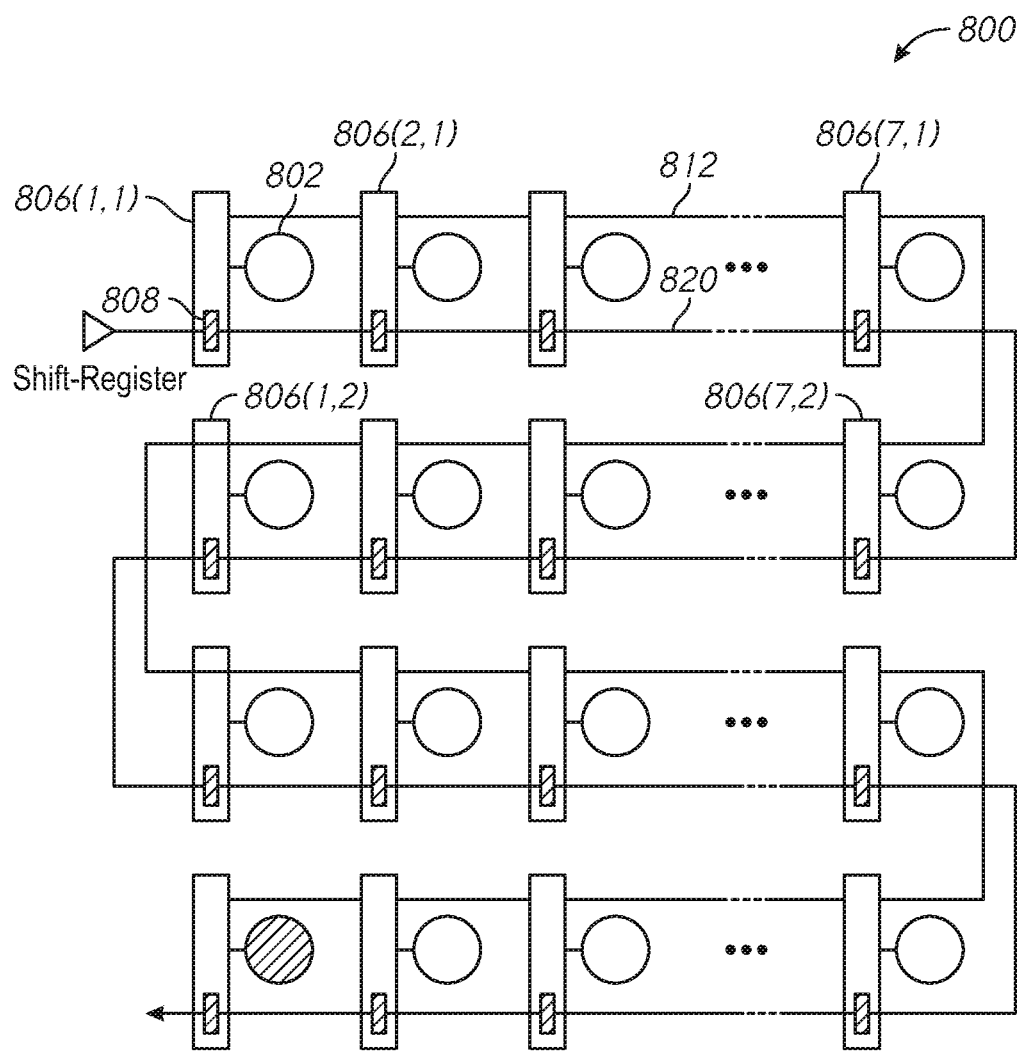
FIG. 8 is a schematic diagram of a TSV array 800 according to an embodiment of the disclosure.

FIG. 8 is a schematic diagram of a TSV array 800 according to an embodiment of the disclosure. The TSV array 800 may be included in the TSV array 206 of FIG. 2 in some embodiments of the disclosure.

The TSV array 800 includes a plurality of TSVs 802 arranged in an array, and further includes a plurality of TSV units 806. Each of the TSV units 806 and a respective TSV 802 are associated with one another. Each of the TSV units 806 includes a respective register 808. The register 808 may be used to store control information for the respective TSV unit 806. The registers 808 may be shift registers in some embodiments of the disclosure.

The TSV units 806 are coupled to a signal line 812 and to a signal line 820. The signal line 812 may be used to change coupling to the TSVs 802. The signal line 820 is coupled to the registers 808 of the TSV units 806, and may be used to provide control information to the registers 808. The signal line 812 and 820 extend through the TSV units 806(1,1) to the TSV unit 806(7,1) and then couple to the TSV unit 806(7,2) to extend through the TSV units to the TSV unit 806(1,2). The signal lines 812 and 820 continue to snake through the TSV units 306 to a last TSV unit 306.

In operation, control information may be provided on the signal line 820 and shifted through the registers 808 to provide respective control information to each of the TSV units 806. For example, in the TSV array 800 of FIG. 8 control information may be provided through the signal line 820 starting with the register 808 in TSV unit 806(1,1) and shifted bit-by-bit sequentially through registers 808 of the TSV units 806 until reaching the last TSV unit, at which time, each of the registers 808 would store control information for the respective TSV unit.

As will be described in more detail below, the TSV units 806 may be used to change a coupling to a TSV 802, for example, from one TSV to an adjacent TSV. The coupling of a TSV 802 by an associated TSV unit is controlled by control information stored in the registers 808. For example, when a register 808 of a TSV unit stores control information corresponding to an active level, the respective TSV unit shifts the coupling from its associated TSV to the TSV associated with an adjacent TSV unit. One or more of the TSVs 802 may be designated as a redundancy TSV (identified in FIG. 8 in cross-hatch). The coupling to an adjacent TSV includes coupling to the redundancy TSV. By changing the coupling of the TSVs 802, including to the redundancy TSV, a TSV array including a defective TSV may be repaired.

The TSV array 800 is shown in FIG. 8 as including 28 TSVs 802 arranged in an array of 4×7 TSVs 802. However, it will be appreciated that embodiments of the disclosure are not limited to the particular number of TSVs shown in FIG. 8, or to the particular arrangement of the TSVs shown in FIG. 8. For example, in some embodiments of the disclosure, a greater number of TSVs and TSV units may be included in a TSV array without departing from the scope of the disclosure. Moreover, the disclosure is not limited to the particular arrangement of the TSV units 806, the registers 808, and the signal lines 812 and 820 to particular arrangement shown in FIG. 8.

In contrast to the TSV arrays 300 and 600 previously described, the TSV array 800 does not include arrangement of cross-point selection lines and registers that are used to control the TSV units. The TSV array 800 instead includes TSV units 806 each having a respective register 808 that is coupled to a signal line 820 to provide control information. The control information stored by the register 808 is used to control the respective TSV unit 806, for example, the coupling of the associated TSV 802. The TSV array 800 may provide an advantage by not having selection lines that pass through the array of TSVs in a cross-point manner, which may reduce circuit layout complexity.

Figure 9:
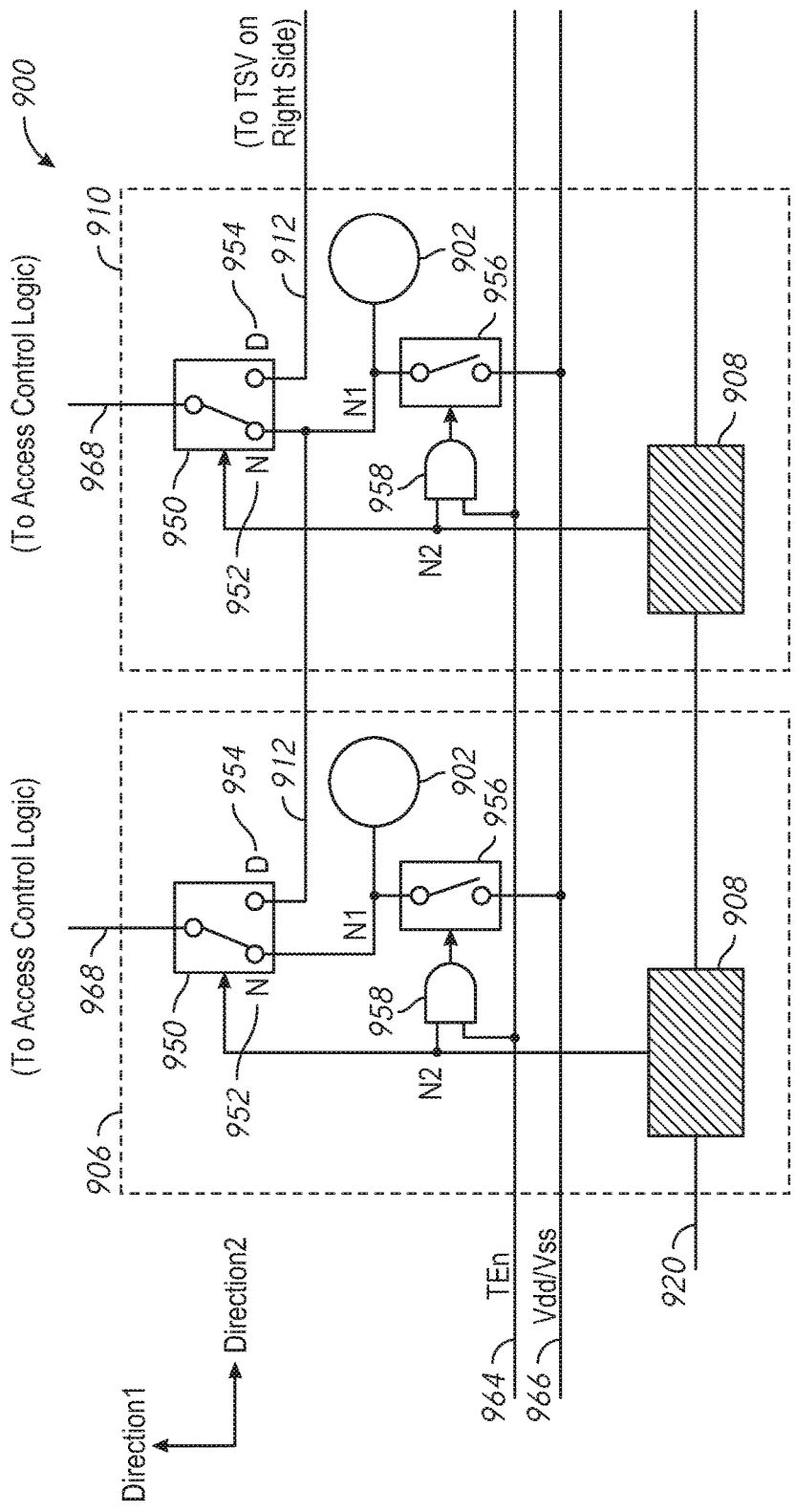
FIG. 9 is a schematic diagram of a plurality of through-silicon/substrate via (TSV) units according to an embodiment of the disclosure.

FIG. 9 is a schematic diagram of a plurality of TSV units according to an embodiment of the disclosure. FIG. 9 illustrates two adjacent TSV units 906 and 910. The TSV unit 906 is upstream of the TSV unit 910, and the TSV unit 910 is downstream the TSV unit 906. The TSV units 906 and 910 may be included in the TSV array 206 (FIG. 2) in some embodiments of the disclosure. The TSV units 906 and 910 may be included in the TSV units 806 (1,1) and 806 (2,1), respectively, (FIG. 8) in some embodiments of the disclosure.

The TSV units 906 and 910 may be similar to the TSV units 406 and 408 previously described with reference to FIG. 4. Each of the TSV units 906 and 910 includes switch 950, switch 956, and logic gate 958, and is associated with a respective a respective TSV 902. However, the TSV units 906 and 910 include a respective register 908. The register 908 may be referred to as a selection circuit for the TSV unit. The register 908 may be a shift register in some embodiments of the disclosure. The register 908 stores control information provided by the signal line 920 that controls the states of the switches 950 and 956. For example, the register 908 stores control information that controls the states of the switches 950 and 956 which respond to the level of the control information. The registers 908 of the TSV units 906 and 910 may be coupled in series to the signal line 920.

The switch 950 is coupled to a signal line 968, and may be used to form a conductive path between the signal line 968 and the TSV 902 of the TSV unit, or to form a conductive path between the signal line 968 and the TSV 902 of an adjacent TSV unit (e.g., a conductive path between the signal line 968 associated with the TSV unit 906 and the TSV 902 of the TSV unit 910). In some embodiments of the disclosure, the signal line 968 may be coupled to access control logic, for example, access control logic 204 of FIG. 2. The control information stored in the register 908 may be used to control the coupling of the TSV 902. For example, when the register 908 stores control information that has an inactive level (e.g., a "0" logic level), the switch 950 may form a conductive path between the signal line 968 associated with the TSV unit 906 and the TSV 902 of the TSV unit 906. Conversely, when the register 908 stores control information that has an active level (e.g., a "1" logic level), the switch 950 may form a conductive path between the signal line 968 associated with the TSV unit 906 and the TSV 902 of the adjacent TSV unit 910.

The switch 956 is coupled to the TSV 902, as previously described, and further coupled to a voltage line 966. The voltage line 966 may provide a voltage, for example, a power supply voltage Vdd, a reference voltage Vss, or other voltage. A logic gate 958 (e.g., an AND logic gate in some embodiments) coupled to the register 908 and a test enable selection line 964 provides a control signal to the switch 956. The selection line 964 has a logic level controlled by a test enable signal TEn that is provided to the selection line 964. The register 908 may store control information that in combination with the level of the selection line 964 may cause the switch 956 to form a conductive path between the voltage line 966 and the TSV 402. For example, when the register 908 stores control information having an active level and the TEn signal sets the selection line 964 to an active level, the switch circuit 956 forms a conductive path between the voltage line 966 and the TSV 902.

The TSV unit 910 is similar to the TSV unit 906. For example, the TSV unit 910 may include similar circuits as the TSV unit 906. Circuits that are similar in the TSV unit 910 are referenced with the same reference number as in the TSV unit 906. The TSV unit 910 may also be coupled to another adjacent TSV unit (not shown in FIG. 9) that is similar to the TSV units 906 and 910. The TSV unit adjacent the TSV unit 910 would include a register 908 that is also coupled to the signal line 920 to receive control information.

The TSV units 906 and 910 may be used when the respective TSV 902 is tested for operation, such as to test resistance of the respective TSV 902, in a manner similar to that as previously described with reference to the TSV units 406 and 408 of FIG. 4. However, rather than using X and Y selection lines, control information may be stored in the respective registers 908 along with an active test enable signal TEn provided on the signal line 964 to control testing.

As previously described, the TSV units 906 and 910 may also be used to change a coupling between a signal line 968 and a TSV 902 for a TSV unit, to a coupling between the signal line 968 for the TSV unit to the TSV 902 for an adjacent TSV unit. For example, the TSV units 906 and 910 may be used to change the coupling between the signal line 968 and the TSV 902 of the TSV unit 906 to a coupling between the signal line 968 (that is associated with the TSV unit 906) and the TSV 902 of the TSV unit 910. Such an arrangement may be used to shift a coupling of an input from a defective TSV of one TSV unit to a functional TSV of another (e.g., adjacent) TSV unit. For example, the TSV units following the TSV unit having a respective defective TSV to a last TSV unit coupled to a redundancy TSV, will all have the respective switch circuits coupling a signal line associated with the TSV unit to a TSV of an adjacent TSV unit. The last TSV unit will have its respective signal line coupled to the redundancy TSV. In this manner, a defective TSV may be replaced by shifting the coupling of signal lines to TSVs of adjacent TSV units.

Figure 10:
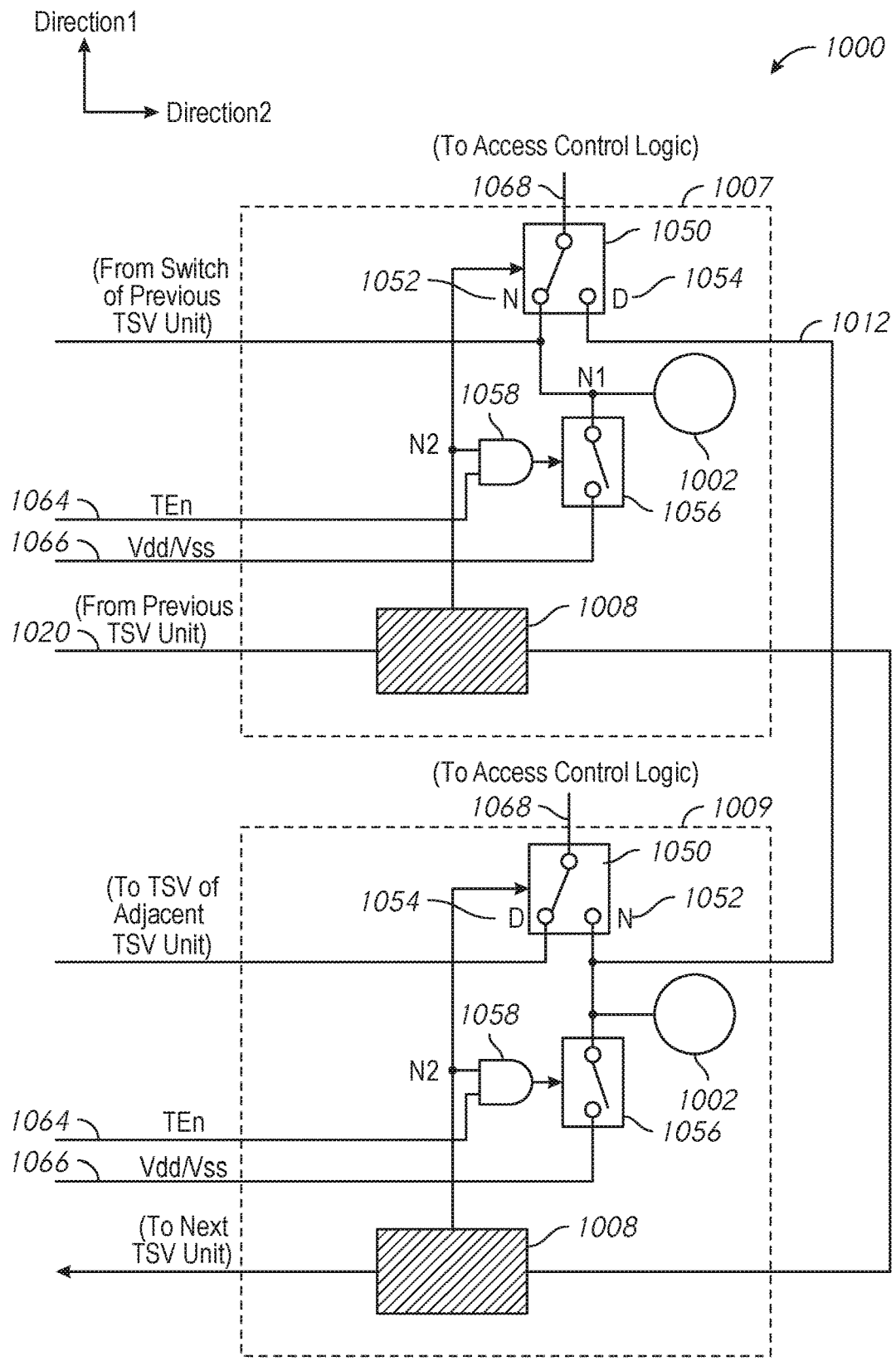
FIG. 10 is a schematic diagram of a plurality of through-silicon/substrate via (TSV) units according to an embodiment of the disclosure.

FIG. 10 is a schematic diagram of a plurality of TSV units according to an embodiment of the disclosure. FIG. 10 illustrates two adjacent TSV units 1007 and 1009. The TSV unit 1007 is upstream the TSV unit 1009, and the TSV unit 1009 is downstream the TSV unit 1007. The TSV units 1007 and 1009 may be included in the TSV array 206 (FIG. 2) in some embodiments of the disclosure. The TSV units 1007 and 1009 may be included in the TSV units 806(7,1) and 806(7,2), respectively, (FIG. 8) in some embodiments of the disclosure.

The TSV units 1007 and 1009 include components similar to those previously described with reference to the TSV units 906 and 910 of FIG. 9. For example, the TSV unit 1007 and 1009 include switch circuits 1050 and 1056 (also referred to as switch 1050 and switch 1056) coupled to an associated TSV 1002. The TSV units 1007 and 1009 also include a respective register 1008. The register 1008 may be referred to as a selection circuit for the TSV unit. The register 1008 may be a shift register in some embodiments of the disclosure. As with the registers 908 of the TSV units 906 and 910, the register 1008 stores control information provided by a signal line 1020 that controls the states of the switches 1050 and 1056.

Similar to the switch 950 of FIG. 9, the switch 1050 forms conductive paths between a signal line 1068 of a TSV unit and either the TSV 1002 of that TSV unit or the TSV 1002 of an adjacent TSV unit. The control information stored by the register 1008 causes the switch 550 to form the conductive paths. For example, when the control information is set to an inactive level (e.g., a low logic level), the switch 1050 is caused to form the conductive path between the signal line 1068 and the TSV 1002 associated with the same TSV unit. In contrast, when the control information is set to an active level (e.g., a high logic level), the switch 1050 is caused to form the conductive path between the signal line 1068 and the TSV 1002 of the adjacent TSV unit 1009.

Similar to the switch 956 of FIG. 9, the switch 1056 forms a conductive path between a voltage line 1066 and the TSV 1002. The voltage line 1066 may provide a voltage, for example, a power supply voltage Vdd, a reference voltage Vss, or other voltage. A logic gate 1058 (e.g., an AND logic gate in some embodiments) coupled to the register 1008 and a test enable selection line 1064 provides a control signal to the switch 1056. The selection line 1064 has a logic level controlled by a test enable signal TEn that is provided to the selection line 1064. The control information stored by the register 1008 in combination with the level of the selection line 1064 may cause the switch 1056 to form a conductive path between the voltage line 1066 and the TSV 1002. For example, when the control information is set to an active level, and the selection line 1066 is set to an active level (e.g., the TEn signal is active), the switch circuit 1056 is caused to form a conductive path between the voltage line 1066 and the TSV 1002.

Similar to the TSV units 906 and 910, the TSV units 1007 and 1009 may be used to test the respective TSV 1002 as well as to change a coupling between a signal line 1068 and a TSV 1002 of a TSV unit, as previously described with reference to TSV units 906 and 910 of FIG. 9. In contrast to the TSV units 906 and 910 of FIG. 9, however, is that the TSV units 1007 and 1009 of FIG. 10 are adjacent one another along the Direction1. An upstream TSV unit may be coupled to the TSV unit 1007 along the Direction2 similar to that as previously described for the coupling between the TSV units 906 and 910. A downstream TSV unit may be coupled to the TSV unit 1009 along the Direction2 similar to that previously described for the coupling of the TSV units 906 and 910. However, a progression of the adjacent TSV units along the Direction2 from the TSV unit 1009 is in a direction opposite to that shown for the TSV units 906 and 910. The TSV units 1007 and 1009 may be used to switch a direction of progression from an upstream TSV unit coupled to the TSV unit 1007 to a downstream TSV unit coupled to the TSV unit 1009. TSV units similar in arrangement to the TSV units 1007 and 1009, but oriented in an opposite direction, may be used to switch the direction of progression in an opposite direction as well.

Those of ordinary skill in the art will have sufficient understanding from the previous description of the TSV units 906, 910, 1007, and 1009 to understand the arrangement of the circuits of the TSV unit to provide such a progression. As such, a specific description for the TSV units will not be provided in the interest of brevity.

Figure 11:
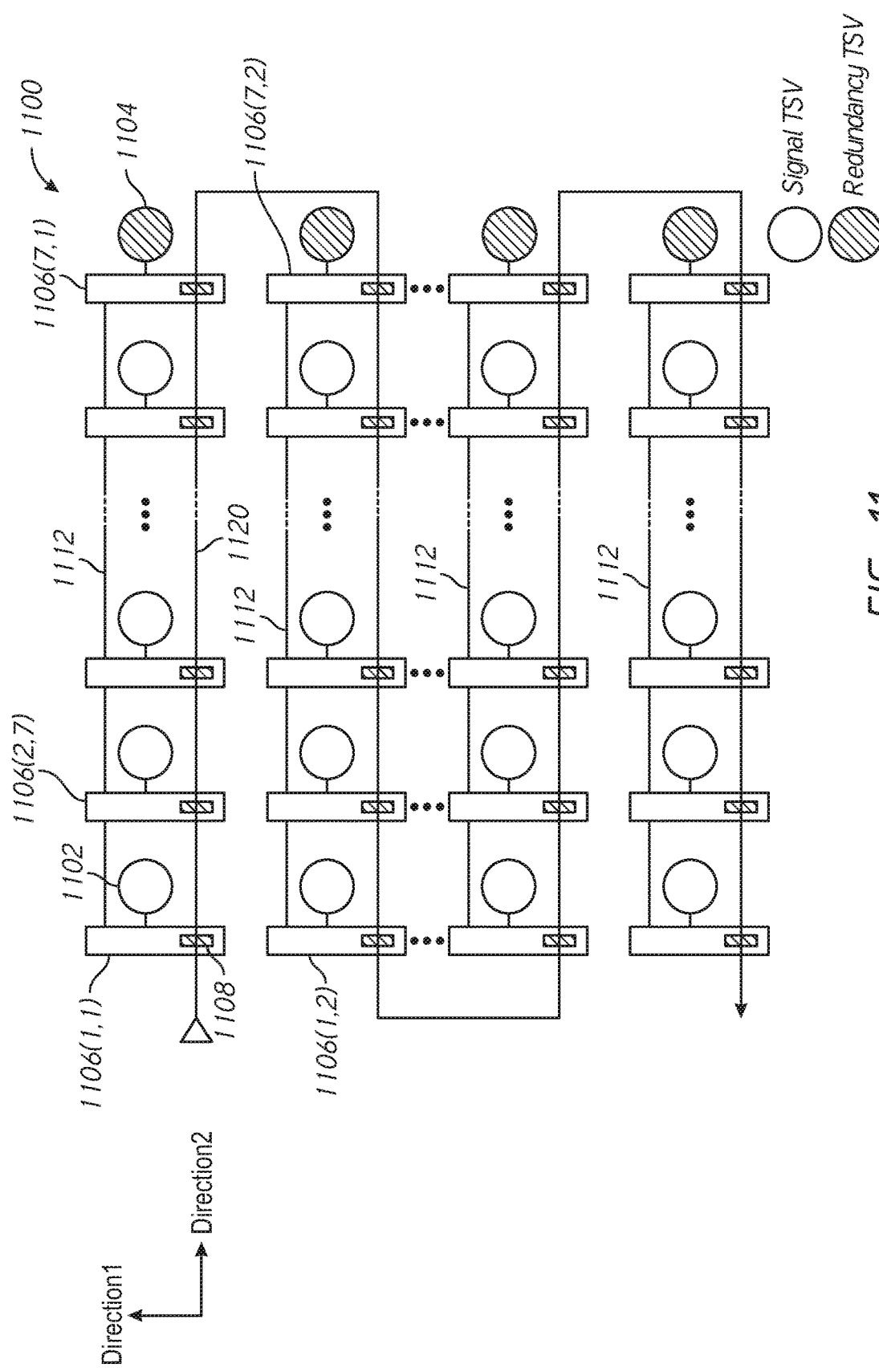
FIG. 11 is a schematic diagram of a TSV array 1100 according to an embodiment of the disclosure.

FIG. 11 is a schematic diagram of a TSV array 1100 according to an embodiment of the disclosure. The TSV array 1100 may be included in the TSV array 206 of FIG. 2 in some embodiments of the disclosure.

The TSV array 1100 includes a plurality of TSVs 1102 and a plurality of TSV units 1106. Each of the TSV units 1106 and a respective TSV 1102 are associated with one another. Each of the TSV units 1106 includes a respective register 1108. The register 1108 may be used to store control information for the respective TSV unit 1106. The registers 1108 may be shift registers in some embodiments of the disclosure. The TSV units 1106 are coupled to a signal line 1112 and to a signal line 1120. The signal line 1112 may be used to change coupling to the TSVs 1102. The signal line 1120 is coupled to the registers 1108 of the TSV units 1106, and may be used to provide control information to the registers 1108. The signal line 1112 extends along Direction 2 through the TSV units 1106 of a row. Each row of TSV units 1106 are coupled to a respective signal line 1112. The signal line 1120 extends through the TSV units 1106(1,1) to the TSV unit 1106(7,1) and then couple to the TSV unit 1106(7,2) to extend through the TSV units to the TSV unit 1106(1,2). The signal line 1120 continues to snake through the TSV units 1106 to a last TSV unit 1106.

The TSV array 1100 is similar to the TSV array 800 of FIG. 8. However, instead of one of the TSVs 1102 designated as a redundancy TSV (e.g., a last TSV), multiple TSVs 1102 of the TSV array are designated as a redundancy TSV. In the example of FIG. 11, a last TSV 1102 of each row of TSVs is designated as a redundancy TSV. The TSV units of a row may be used to change a coupling of the TSVs to correct a defective TSV in that row. For example, each of the rows may have a respective defective TSV 1102, which may be bypassed by changing the coupling of the TSVs 1102 to include the redundancy TSV at the end of the row of TSV units.

Control information may be provided to each of the registers 1108 through the signal line 1120 in a manner similar to that previously described with reference to FIG. 8. In operation, control information may be provided on the signal line 1120 and shifted through the registers 1108 to provide respective control information to each of the TSV units 1106. For example, in the TSV array 1100 of FIG. 11 control information may be provided through the signal line 1120 starting with the register 1108 in TSV unit 1106(1,1) and shifted bit-by-bit sequentially through registers 1108 of the TSV units 1106 until reaching the last TSV unit, at which time, each of the registers 1108 would store control information for the respective TSV unit.

Figure 12:
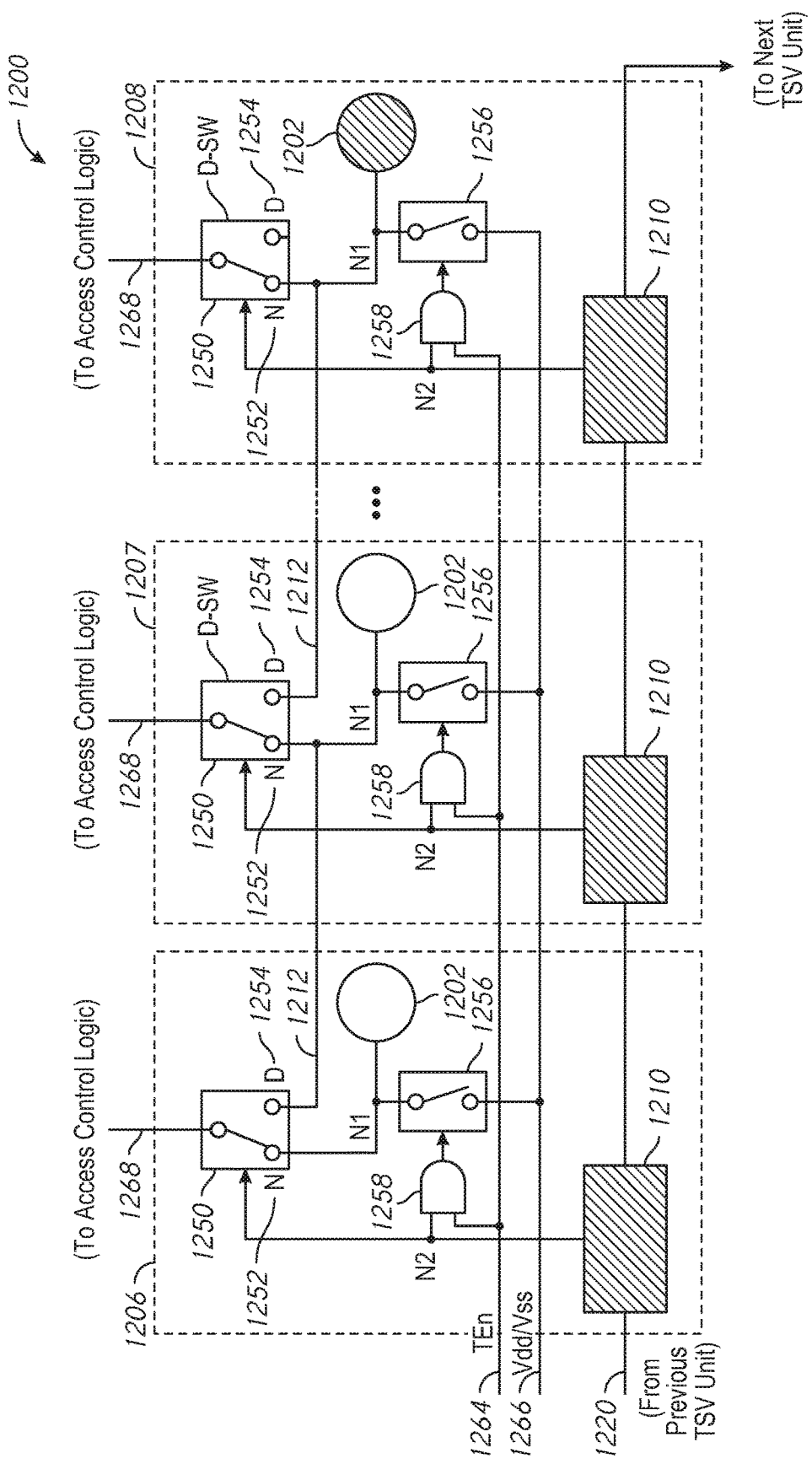
FIG. 12 is a schematic diagram of a plurality of TSV units according to an embodiment of the disclosure.

FIG. 12 is a schematic diagram of a plurality of TSV units according to an embodiment of the disclosure. FIG. 12 illustrates TSV units 1206, 1207, and 1208. The TSV unit 1207 is downstream the TSV unit 1206, and the TSV unit 1208 is downstream the TSV unit 1207. The TSV unit 1207 is upstream the TSV unit 1208 and the TSV unit 1206 is upstream the TSV unit 1207. The TSV units 1206, 1207, and 1208 may be included in the TSV array 206 (FIG. 2) in some embodiments of the disclosure. The TSV units 1206, 1207, and 1208 may be included in the TSV units 1106(1,1), 1106(2,1), 1106(7,1) (FIG. 11), respectively, in some embodiments of the disclosure.

Each of the TSV units 1206, 1207, and 1208 may be similar to the TSV units 906 and 910 previously described with reference to FIG. 9. Each of the TSV units 1206, 1207, and 1208 includes register 1208, switch 1250, switch 1256, and logic gate 1258, and is associated with a respective TSV 1202. The registers 1208 are coupled to a signal line 1220. The TSV 1202 of the TSV unit 1208 is designated as a redundancy TSV.

Operation of the TSV units 1206, 1207, and 1208 for changing a coupling of the TSV 1202 and for coupling a voltage line 1266 to the TSV 1202 is similar to that previously described for the TSV units 906 and 910, and the description of such is not provided in the interest of brevity.

As previously described with reference to FIG. 11, including a TSV designated as a redundancy TSV for each row of TSV units (e.g., TSV 1202 for TSV unit 1208) may be advantageous as allowing for a defective TSV to be repaired in each row of a TSV array.

Although this disclosure has been disclosed in the context of certain preferred embodiments and examples, it will be understood by those skilled in the art that the disclosure extends beyond the specifically disclosed embodiments to other alternative embodiments and/or uses of the disclosure and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosure. Thus, it is intended that the scope of at least some of the disclosure herein disclosed should not be limited by the particular disclosed embodiments described above.

The invention claimed is:

1. An apparatus comprising:
a plurality of first selection lines each extending in a first direction;
a plurality of second selection lines each extending in a second direction to cross the plurality of first selection lines; and
a plurality of a through-substrate via (TSV) units disposed in intersections of the plurality of first selection lines and the plurality of second selection lines, respectively;
wherein each TSV unit of the plurality of TSV units comprises:
a TSV;
a switch coupled to the TSV; and
a selection circuit coupled to an associated one of the plurality of first selection lines and an associated one of the plurality of second selection lines, the selection circuit configured to control a switching state of the switch responsive to each of the associated one of the plurality of first selection lines and the associated one of the plurality of second selection lines being set to an active level.

2. The apparatus of claim 1,
wherein the switch is inserted between the TSV and a voltage line; and
wherein the selection circuit is further configured to cause the switch to form a conductive path between the TSV and the voltage line responsive to each of the associated one of the plurality of first selection lines and the associated one of the plurality of second selection lines being set to the active level.

3. The apparatus of claim 1,
wherein the switch includes a first node coupled to the TSV, a second node coupled to an adjacent TSV unit, and a third node coupled to a signal line; and
wherein the selection circuit is further configured to cause the switch to form a first conductive path between the TSV and the signal line responsive to at least one of the associated one of the plurality of first selection lines and the associated one of the plurality of second selection lines being set to an inactive level, the selection circuit further configured to cause the switch to form a second conductive path between the adjacent TSV unit and the signal line responsive to each of the associated one of the plurality of first selection lines and the associated one of the plurality of second selection lines being set to the active level.

4. The apparatus of claim 1,
wherein the apparatus further comprises:
a plurality of third selection lines each extending in the first direction; and a plurality of fourth selection lines each extending in the second direction;

wherein each TSV unit of the plurality of TSV units further comprises an additional switch coupled to the TSV; and wherein the selection circuit is further coupled to an associated one of the plurality of third selection lines and an associated one of the plurality of fourth selection lines, the selection circuit further configured to control a switching state of the additional switch responsive to each of the associated one of the plurality of third selection lines and the associated one of the plurality of fourth selection lines being set to an active level.

5. The apparatus of claim 1, wherein the switch coupled to the TSV is configured to be deactivated responsive to the associated one of the plurality of first selection lines and the associated one of the plurality of second selection lines being set to an inactive level.

6. The apparatus of claim 1, wherein each TSV unit of the plurality of TSV units further comprises an additional switch coupled to the TSV.

7. The apparatus of claim 1, wherein the switch is coupled to a signal line, and wherein the selection circuit is further configured to control the switch to form a conductive path between the signal line and the TSV responsive to at least one of the associated one of the plurality of first selection lines and the associated one of the plurality of second selection lines being set to an inactive level.

8. The apparatus of claim 7, wherein responsive to the at least one of the associated one of the plurality of first selection lines and the associated one of the plurality of second selection lines set to an inactive level, the selection circuit controls the switch to be deactivated, and the conductive path between the signal line and the TSV is formed by the deactivated switch.

9. The apparatus of claim 1, wherein the selection circuit further configured to control the switching state of the switch to form a conductive path with another TSV adjacent to the TSV, responsive to each of the associated one of the plurality of first selection lines and the associated one of the plurality of second selection lines being set to the active level.

10. The apparatus of claim 9, further comprising a plurality of signal lines coupled to the plurality of TSV units, respectively, wherein the activated switch forms the conductive path between the signal line and the other TSV adjacent to the TSV.

11. An apparatus comprising:

a plurality of first selection lines extending in a first direction;

a plurality of second selection lines extending in a second direction;

a plurality of selection circuits coupled at respective intersections of the plurality of first selection lines and the plurality of second selection lines; and a plurality of through-substrate vias (TSVs) coupled to the plurality of selection circuits, respectively, wherein the plurality of selection circuits are coupled to a plurality of switches, respectively, and each of the selection circuits is configured to control an associated one of the plurality of switches responsive to a logic level of an associated one of the plurality of first selection lines and a logic level of an associated one of the plurality of second selection lines.

12. The apparatus of claim 11, wherein each switch of the plurality of switches is coupled to a signal line, and wherein at least one selection circuit of the plurality of selection circuits is further configured to cause at least one associated switch of the plurality of switches to form a first conductive path between at least one associated TSV of the plurality of TSVs and at least one associated signal line of the plurality of signal lines responsive to at least one associated first selection line of the plurality of first selection lines and at least one associated second selection line of the plurality of second selection lines being set to an inactive level.

13. The apparatus of claim 12, wherein at least one other selection circuit of the plurality of selection circuits is further configured to cause at least one associated switch of the plurality of switches to form a second conductive path between a TSV adjacent to at least one associated TSV of the plurality of TSVs and at least one associated signal line of the plurality of signal lines responsive to each of at least one associated first selection line of the plurality of first selection lines and at least one associated second selection line of the plurality of second selection lines being set to an active level.

14. The apparatus of claim 11, wherein at least one TSV of the plurality of TSVs is coupled to a voltage line through the associated one of the plurality of switches responsive to an activation of the associated one of the plurality of switches.

15. The apparatus of claim 14, wherein at least one TSV of the plurality of TSVs is coupled to a voltage line responsive to an active level of each of the associated one of the plurality of first selection lines and the associated one of the plurality of second selection lines.

16. The apparatus of claim 11, wherein the plurality of TSVs are further coupled to a plurality of additional switches, respectively.

17. An apparatus comprising:

a signal line;

a plurality of through-substrate vias (TSVs);

a plurality of a through-substrate via (TSV) units;

wherein each TSV unit of the plurality of TSV units is associated with a respective TSV of the TSVs of the plurality of TSVs, and each TSV unit comprises:

a switch coupled to the respective TSV and coupled to another signal line;

a register coupled to the signal line and configured to store respective control information provided to the register on the signal line, the register further coupled to the switch, wherein the register is configured to control a switching state of the switch responsive to control information stored in the register and to control the switch to be deactivated responsive the control information stored in the register being set to an inactive level, and wherein, the register is further configured to control the switch to form a first conductive path between the TSV and the another signal line responsive to the control information being set to the inactive level.

18. An apparatus comprising:

a signal line;

a plurality of through-substrate vias (TSVs);

a plurality of a through-substrate via (TSV) units;

wherein each TSV unit of the plurality of TSV units is associated with a respective TSV of the TSVs of the plurality of TSVs, and each TSV unit comprises:

a switch coupled to the respective TSV and coupled to another signal line;

a register coupled to the signal line and configured to store respective control information provided to the register on the signal line, the register further coupled to the switch, wherein the register is configured to control a switching state of the switch responsive to control information stored in the register and to control the switch to be activated responsive the control information stored in the register being set to an active level, and wherein, the register is further configured to controls the switch to not form a first conductive path between the TSV and the another signal line responsive to the control information being set to the active level.

19. The apparatus of claim 18, wherein, when the switch is controlled to be activated, the switch is configured to form a second conductive path between the another signal line and an adjacent TSV unit of the plurality of TSV units.

* * * * *